(12) United States Patent
Matsushima

(10) Patent No.: US 8,492,885 B2
(45) Date of Patent: Jul. 23, 2013

(54) SEMICONDUCTOR STORAGE DEVICE AND MANUFACTURING METHOD THEREOF

(75) Inventor: Ryoji Matsushima, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/599,575

(22) Filed: Aug. 30, 2012

(65) Prior Publication Data

US 2012/0319257 A1 Dec. 20, 2012

Related U.S. Application Data

(63) Continuation of application No. 13/027,668, filed on Feb. 15, 2011, now Pat. No. 8,269,325.

(30) Foreign Application Priority Data

| Feb. 15, 2010 | (JP) | ................. | 2010-030350 |
| Sep. 30, 2010 | (JP) | ................. | 2010-222469 |
| Dec. 15, 2010 | (JP) | ................. | 2010-279877 |

(51) Int. Cl.
*H01L 23/495* (2006.01)

(52) U.S. Cl.
USPC ............ 257/676; 257/668; 257/E23.031

(58) Field of Classification Search
USPC ............................ 257/676, 668, E23.031
See application file for complete search history.

(56) References Cited

U.S. PATENT DOCUMENTS

| 7,193,305 B1 | 3/2007 | Miks et al. |
| 7,795,715 B2 * | 9/2010 | Takiar et al. ............ 257/679 |
| 8,004,071 B2 * | 8/2011 | Nishiyama et al. ...... 257/676 |

FOREIGN PATENT DOCUMENTS

| JP | 2-30597 | 1/1990 |
| JP | 7-282218 | 10/1995 |
| JP | 2003-308508 | 10/2003 |
| JP | 2004-349396 | 12/2004 |
| JP | 2006-221501 | 8/2006 |
| JP | 2007-134486 | 5/2007 |
| JP | 2009-176849 | 8/2009 |
| WO | WO 2007/088757 A1 | 8/2007 |

OTHER PUBLICATIONS

Japanese Office Action issued Aug. 9, 2011, in Patent Application No. 2010-279877 (with English-language translation).
Japanese Office Action issued Nov. 15, 2011, in Patent Application No. 2010-279877 (with English-language translation).

* cited by examiner

*Primary Examiner* — Jenny L Wagner
(74) *Attorney, Agent, or Firm* — Oblon, Spivak, McClelland, Maier & Neustadt, L.L.P.

(57) ABSTRACT

According to one embodiment, a semiconductor storage device includes an organic board provided with external connection terminals on one surface and formed as an individual piece into a plane shape substantially identical to that of an area where the external connection terminals are provided, a lead frame having a mounting area positioned relative to the organic board, and a semiconductor memory chip bonded to the mounting area.

4 Claims, 24 Drawing Sheets

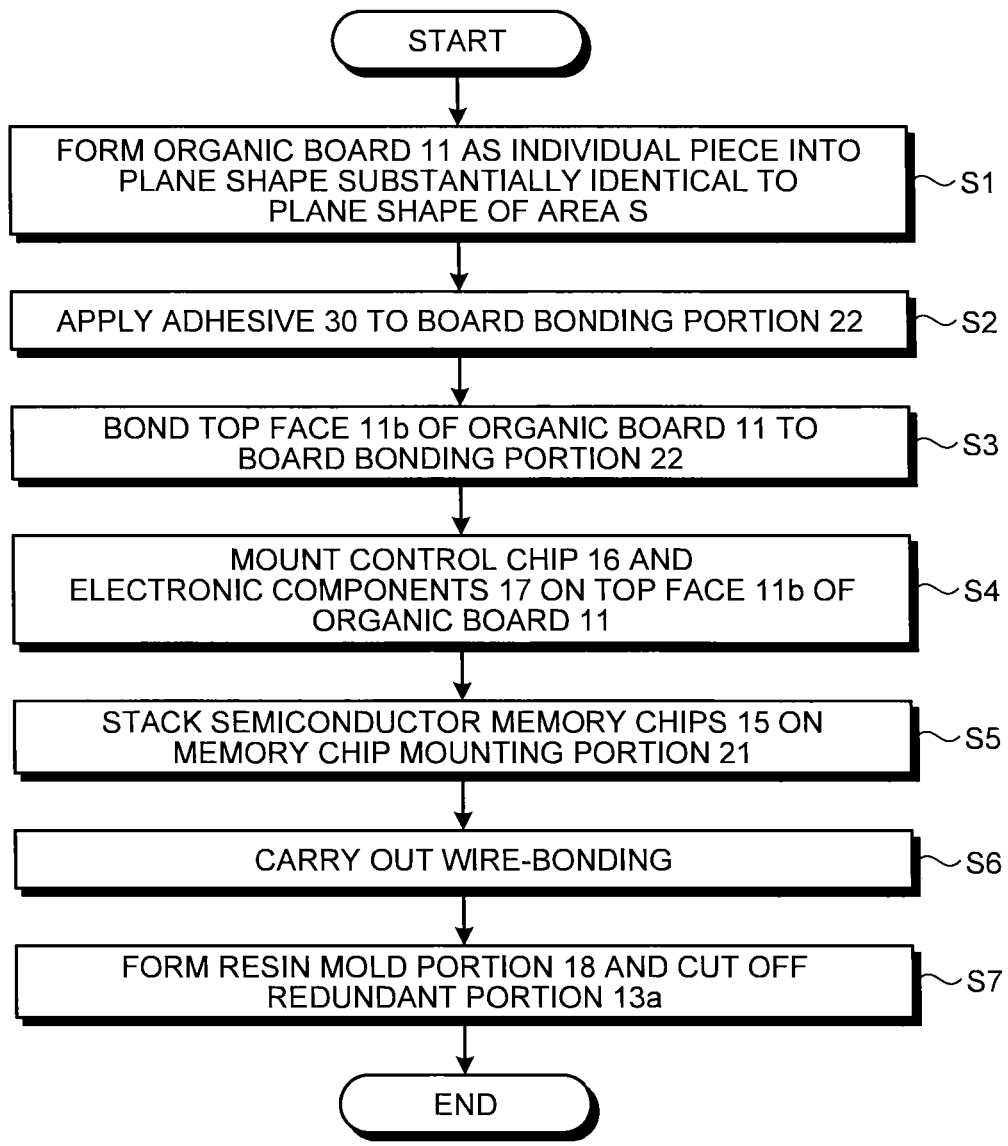

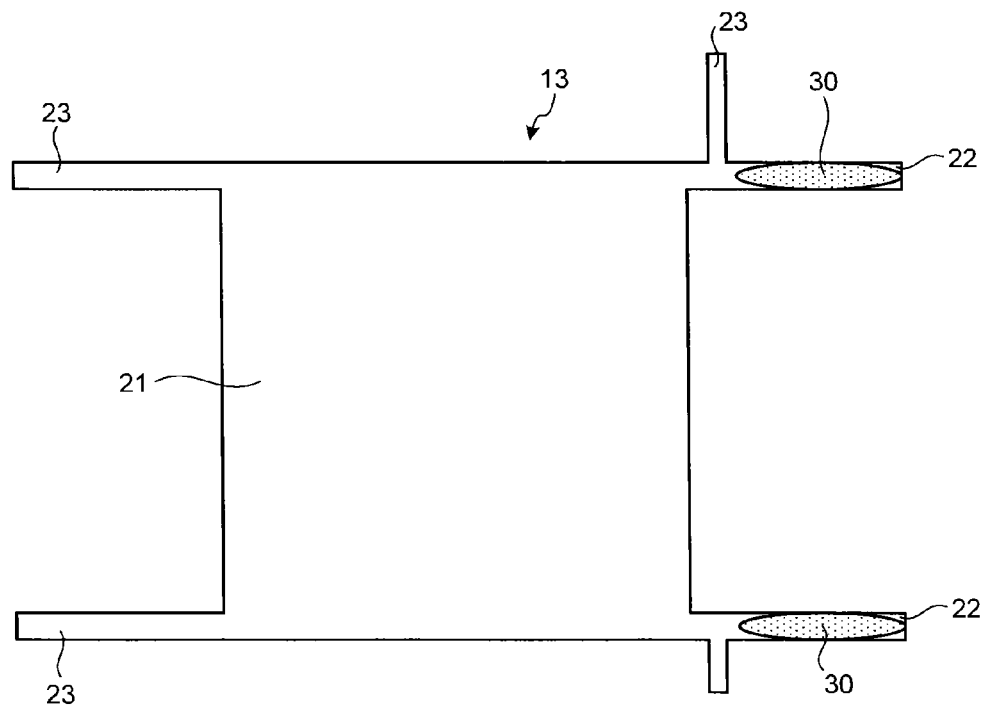
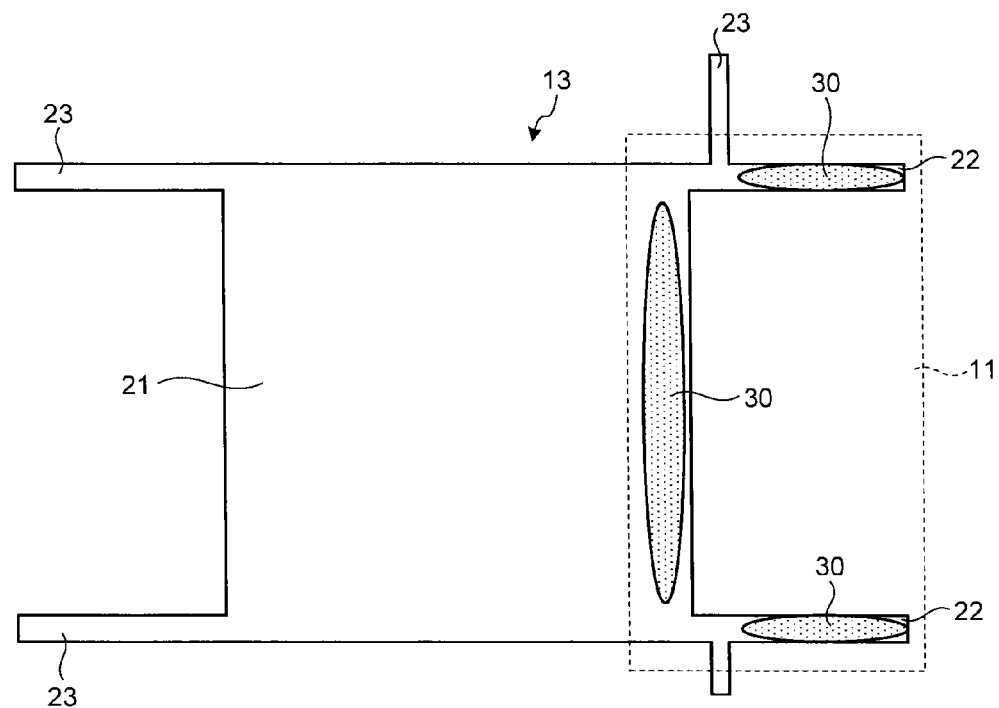

SEMICONDUCTOR STORAGE DEVICE AND MANUFACTURING METHOD THEREOF

CROSS-REFERENCE TO RELATED APPLICATIONS

This application is a continuation application of and claims the benefit of priority from U.S. application Ser. No. 13/027,668, filed Feb. 15, 2011, which is based upon and claims the benefit of priority from the prior Japanese Patent Application No. 2010-30350, filed on Feb. 15, 2010, the prior Japanese Patent Application No. 2010-222469, filed on Sep. 30, 2010, and the prior Japanese Patent Application No. 2010-279877, filed on Dec. 15, 2010, the entire contents of each of which is incorporated herein by reference.

FIELD

Embodiments described herein relate generally to a semiconductor storage device and a manufacturing method thereof.

BACKGROUND

In recent years, semiconductor storage devices using a storage element such as a NAND-type flash memory are frequently used as storage devices of electronic devices such as mobile phones and personal computers. As a semiconductor storage device used in electronic devices, a memory card (semiconductor memory card) can be exemplified.

In a semiconductor storage device, a semiconductor chip such as a semiconductor memory chip and controller chip is mounted on a wiring board on which external terminals are formed. Electrodes of the semiconductor chip are electrically connected to connection pads of the wiring board by applying wire bonding and further, the semiconductor chip is sealed by covering the entire chip with resin.

While such semiconductor storage devices are increasingly used more widely, the reduction of manufacturing costs of semiconductor storage devices are being implemented. For example, an organic board formed of a relatively expensive material is used as the wiring board and a technology to hold down manufacturing costs of semiconductor storage devices by adopting an L-letter shape in a plane view for the shape of the organic board to hold down the usage of the organic board is disclosed.

However, a mounting area of a semiconductor memory chip occupying a relatively large area in a semiconductor storage device is formed of an organic board. Thus, the effect of holding down manufacturing costs tends to be limited.

BRIEF DESCRIPTION OF THE DRAWINGS

FIG. 7 is a flow chart illustrating a manufacturing process of the semiconductor storage device;

FIG. 8A is a diagram illustrating the manufacturing process of the semiconductor storage device;

FIG. 8B is a diagram illustrating another example of the manufacturing process of the semiconductor storage device;

DETAILED DESCRIPTION

In general, according to one embodiment, a semiconductor storage device includes an organic board provided with external connection terminals on one surface and formed as an individual piece into a plane shape substantially identical to that of an area where the external connection terminals are provided, a lead frame having a mounting area positioned relative to the organic board, and a semiconductor memory chip bonded to the mounting area is provided.

Exemplary embodiments of the semiconductor storage device and the manufacturing method thereof will be explained below in detail with reference to the accompanying drawings. The present invention is not limited to the following embodiments.

Figure 1:
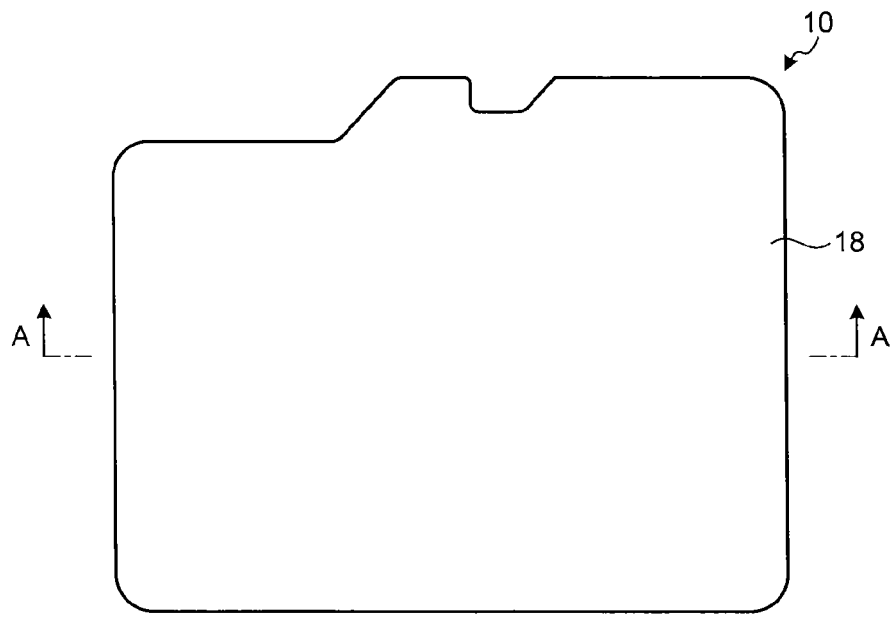
FIG. 1 is a plan view illustrating an appearance of a semiconductor storage device according to a first embodiment.
Figure 2:
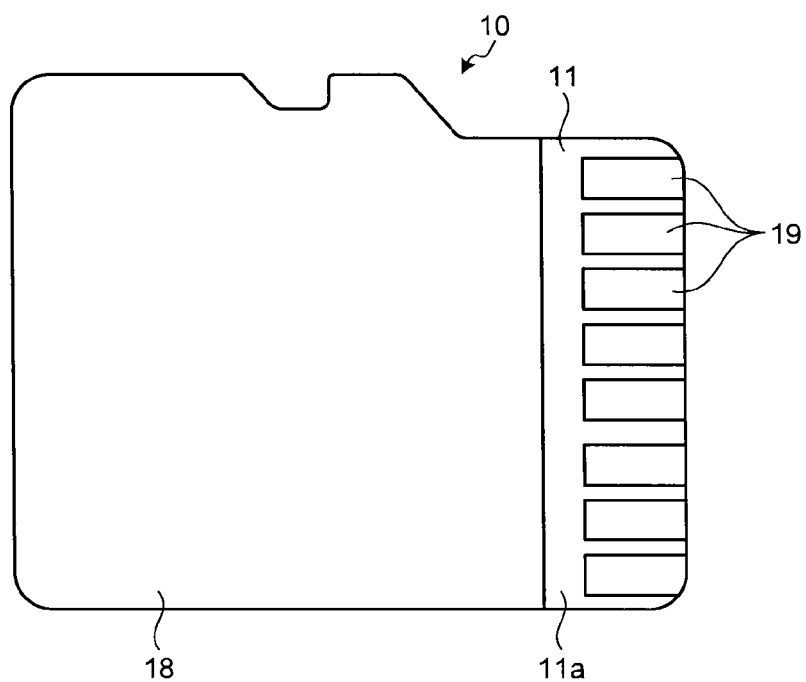
FIG. 2 is a bottom view illustrating the appearance of the semiconductor storage device illustrated in FIG. 1.
Figure 3A:
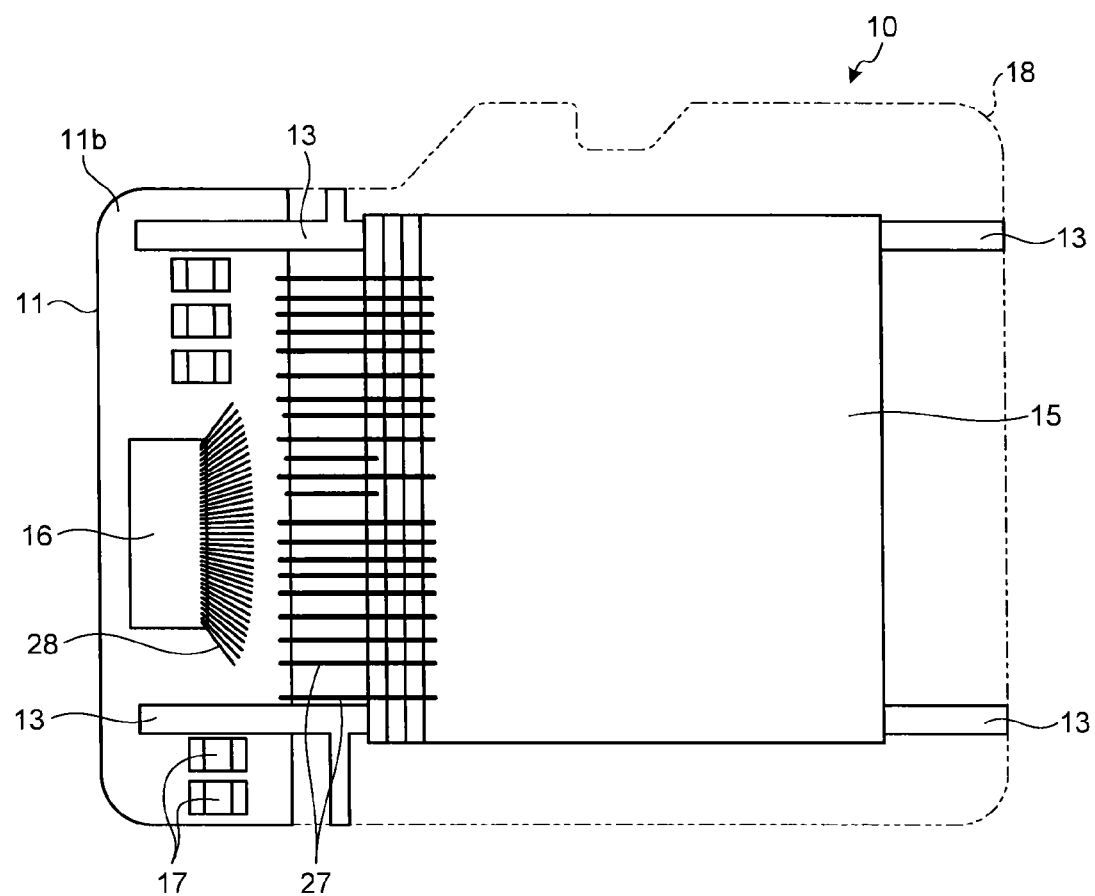
FIG. 3A is a diagram schematically illustrating an internal configuration of the semiconductor storage device illustrated in FIG. 1.
Figure 4:
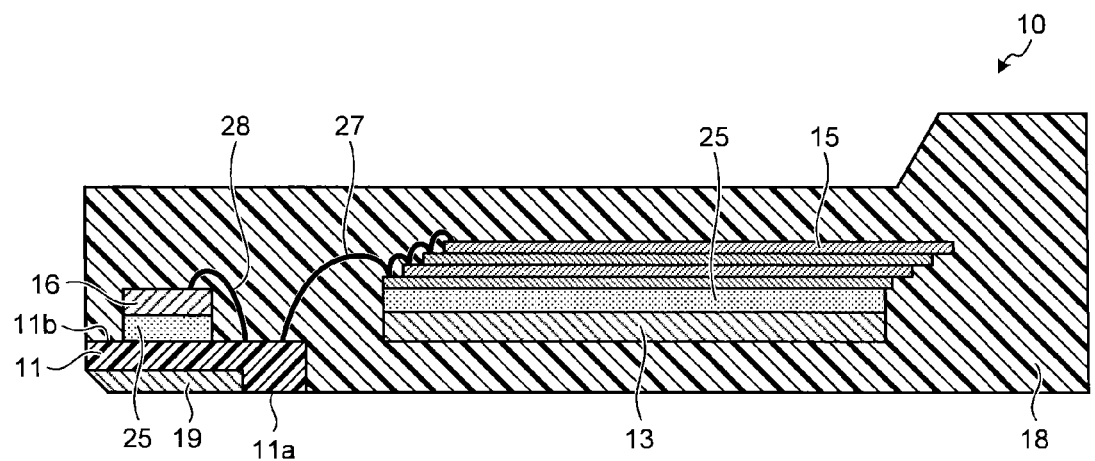
FIG. 4 is a cross sectional view illustrating a sectional structure along an A-A line of the semiconductor storage device illustrated in FIG. 1.

FIG. 1 is a plan view illustrating an appearance of the semiconductor storage device according to the first embodiment. FIG. 2 is a bottom view illustrating the appearance of the semiconductor storage device illustrated in FIG. 1. FIG. 3A is a diagram schematically illustrating the internal configuration of the semiconductor storage device illustrated in FIG. 1. FIG. 4 is a cross sectional view illustrating the sectional structure along the A-A line of the semiconductor storage device illustrated in FIG. 1. A semiconductor storage device 10 is, for example, a micro SD card (registered trademark).

The semiconductor storage device 10 includes an organic board 11, a lead frame 13, a semiconductor memory chip 15, a controller chip 16, electronic components 17, and a resin mold portion 18. As shown in FIGS. 1 and 2, the outer circumference of the semiconductor storage device 10 is covered with the resin mold portion 18 while external connection terminals 19 are exposed on a bottom side.

The organic board 11 is formed by providing wiring inside, for example, an insulating resin board or on the surface thereof and functions both as an element mounting board and a termination forming board. As the organic board 11, a printed wiring board using a glass-epoxy resin or BT resin (bismaleimide-triazine resin) is used. Though a detailed illustration is omitted, the organic board 11 is has a multi-layer structure and may have different materials used in each layer.

Figure 5:
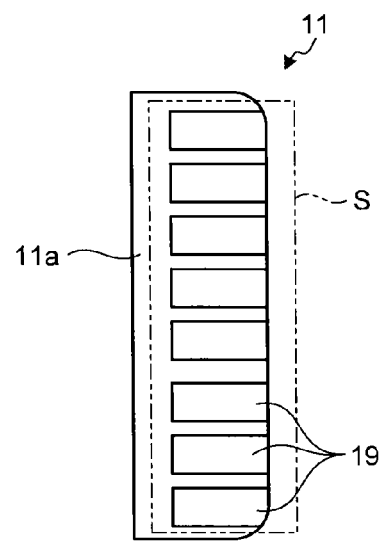
FIG. 5 is a bottom view of an organic board.

FIG. 5 is a bottom view of the organic board 11. The external connection terminals 19 made of metal layer are provided on a bottom face (one surface) 11a of the organic board 11. The external connection terminals 19 become input/output terminals of the semiconductor storage device 10. The organic board 11 is formed as an individual piece into a plane shape substantially identical to that of an area S where the external connection terminals 19 are provided.

A top face 11b (the other surface) of the organic board 11 is a mounting surface to mount the controller chip 16 and the electronic components 17. Thus, the area of the top face 11b of the organic board 11 is larger than the area of the controller chip 16 or that of the electronic components 17 when viewed from the top face thereof. The organic board 11 has a multi-layer structure with a wiring layer in which internal wiring is formed. A plurality of connection pads (not illustrated) is formed on the top face 11b of the organic board 11. A connection pad and the external connection terminal 19 or the connection pads are electrically connected via the internal wiring (including through holes) formed in the wiring layer of the organic board 11. By electrically connecting electrode pads (not illustrated) the semiconductor memory chip 15 and the controller chip 16 to the connection pads, each unit such as the semiconductor memory chip 15, the controller chip 16, and the external connection terminals 19 are electrically connected.

The connection pad connected to the semiconductor memory chip 15 among the plurality of connection pads is arranged in a direction in which the external connection terminals 19 are arranged to be opposite to the side of the lead frame 13. The connection pad connected to the controller chip 16 among the plurality of connection pads is arranged near the electrode pad of the controller chip 16. As a result, the electrode pad of the semiconductor memory chip 15 and a connection pad arranged on the top face 11b of the organic board 11 can directly be connected by a metal wire 28. Also, the electrode pad of the controller chip 16 and a connection pad arranged on the top face 11b of the organic board 11 can directly be connected by a metal wire 27.

The pitch of the connection pad electrically connected to the semiconductor memory chip 15 among the plurality of connection pads is about 80 to 150 μm and the pitch of the connection pad electrically connected to the controller chip 16 is about 50 to 120 μm and thus, the pitch of the connection pad electrically connected to the controller chip 16 is smaller than that of the connection pad electrically connected to the semiconductor memory chip 15.

Figure 6:
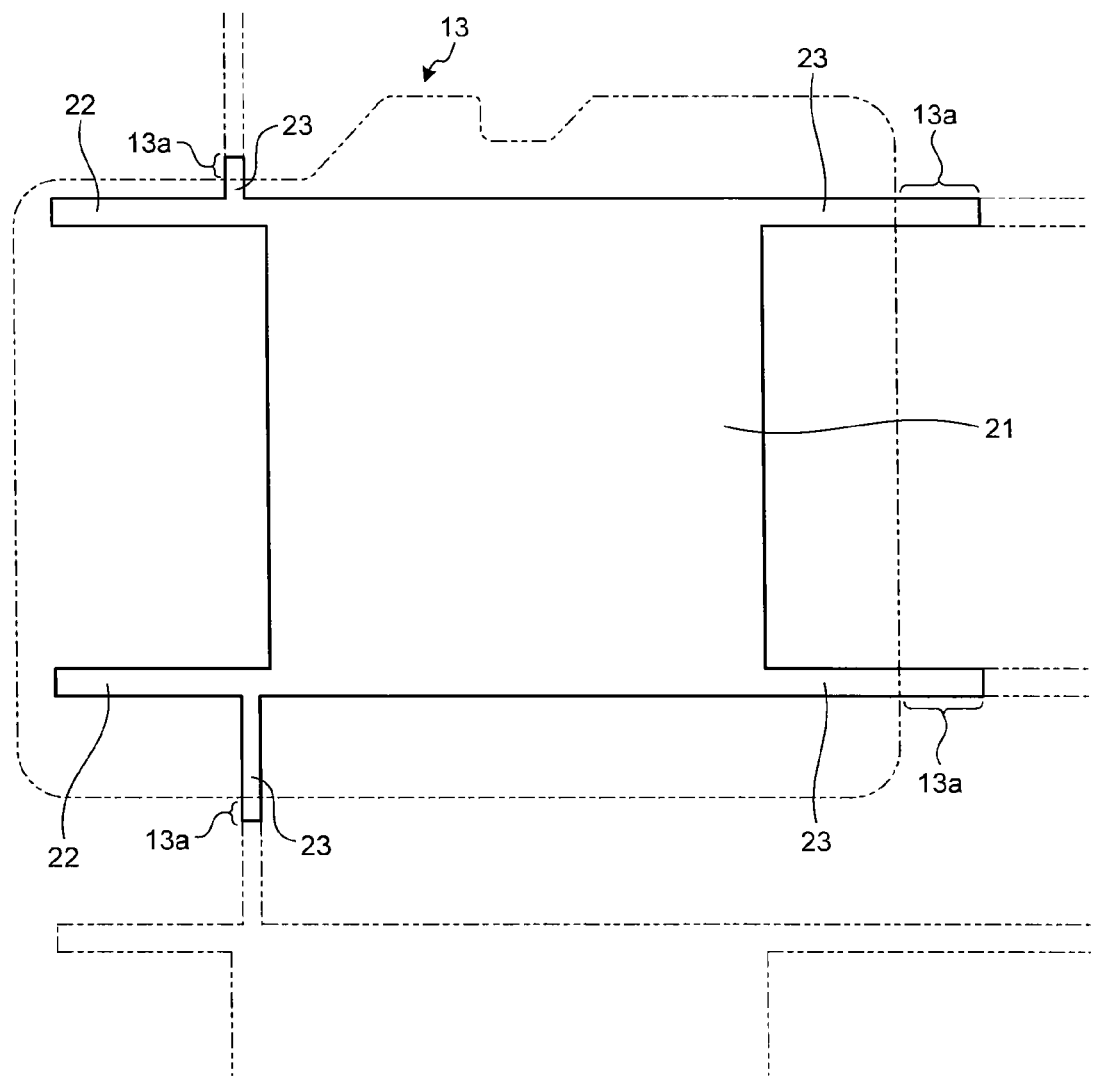
FIG. 6 is a plan view of a lead frame.

FIG. 6 is a plan view of the lead frame 13. The lead frame 13 is configured by using a common material, for example, 42Alloy or copper relatively cheaper than the material used for the organic board 11. The lead frame 13 includes a memory chip mounting portion (mounting portion) 21, a board bonding portion 22, and a connection portion 23.

The memory chip mounting portion 21 is an area to mount the semiconductor memory chip 15. The board bonding portion 22 and the connection portion 23 are formed around the memory chip mounting portion 21 as if to extend from the memory chip mounting portion 21. The board bonding portion 22 is an area bonded to the top face 11b of the organic board 11. By bonding the board bonding portion 22 to the top face 11b of the organic board 11, the board bonding portion 22 can be bonded to the organic board 11 without causing the board bonding portion 22 and the external connection terminals 19 to interfere. By arranging an edge (an edge on the side not connected to the memory chip mounting portion 21) of the board bonding portion 22 inside the organic board 11, the board bonding portion 22 (the lead frame 13) is not exposed from the side face on the side on which the external connection terminals 19 are arranged in the final shape of the semiconductor storage device 10. As a result when the semiconductor storage device 10 is inserted into a connector, the possibility of erroneous connection between a connector terminal and the lead frame 13 can be reduced. By bonding the board bonding portion 22 to the top face 11b of the organic board 11, the memory chip mounting portion 21 is positioned in a position deviating from the organic board 11. If the organic board 11 is thick and the possibility of erroneous connection between a connector terminal and the lead frame 13 is low, the board bonding portion 22 and the connection portion 23 of the lead frame 13 can be save as both.

Figure 3B:
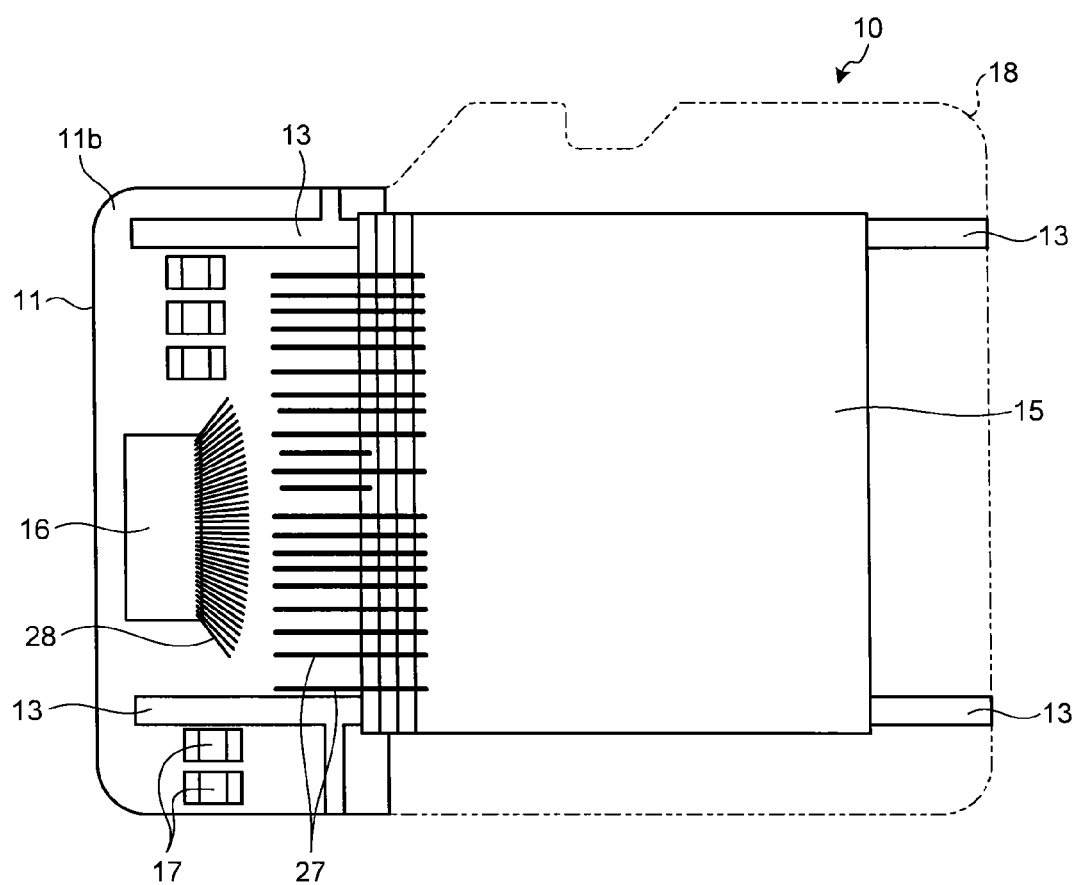
FIG. 3B is a diagram schematically illustrating the internal configuration of another example of the semiconductor storage device illustrated in FIG. 1.

However, the memory chip mounting portion 21 may directly be bonded to the organic board 11 (FIG. 3B). As a result, even if the chip area of the semiconductor memory chip 15 becomes large, there is no need to increase the size of the semiconductor storage device 10. This is particularly effective if the size of the external shape is decided by specifications thereof like the micro SD card (registered trademark). Moreover, with the memory chip mounting portion 21 being directly bonded to the organic board 11, the bonding area between the organic board 11 and the lead frame 13 grows so that an adhesive strength between the organic board 11 and the lead frame 13 can be increased. When the memory chip mounting portion 21 is directly bonded to the organic board 11, the semiconductor memory chip 15 and organic board 11 may be overlapped when viewed from above.

The connection portion 23 connects the memory chip mounting portions 21. The lead frame 13 is configured by the plurality of memory chip mounting portions 21 being connected by the connection portion 23. Thus, by connecting the plurality of memory chip mounting portions 21, a large number of the semiconductor storage devices 10 can be manufactured in a collective manner. In FIG. 6, the external shape of the semiconductor storage device 10 is indicated by a chain double-dashed line. A redundant portion 13a of the connection portion 23 protruding from the external shape of the semiconductor storage device 10 is cut off and removed in the end.

The semiconductor memory chip 15 is a storage element such as a NAND-type flash memory. The semiconductor memory chip 15 has a plurality of electrode pads on one side thereof. The pitch of electrode pads of the semiconductor memory chip 15 is about 80 μm or more and the connection pad electrically connected to the semiconductor memory chip 15 among the plurality of connection pads of the organic board 11 is formed to about 80 to 150 μm fitting to the semiconductor memory chip 15. The plurality of semiconductor memory chips 15 is stacked on the memory chip mounting portions 21. The semiconductor memory chips 15 in the lowest layer among the plurality of semiconductor memory chips 15 is bonded to the memory chip mounting portion 21 by an adhesive material 25. As the adhesive material 25, for example, a thermosetting or photo-setting die attach film (adhesive film) or a liquid material having a common polyimide resin, epoxy resin, and acryl resin as main components is used.

By stepwise stacking the other semiconductor memory chips 15 on top of the semiconductor memory chip 15 in the lowest layer bonded to the memory chip mounting portions 21, the plurality of semiconductor memory chips 15 is stacked. By stepwise stacking the semiconductor memory chips 15, electrode pads provided on one side of the semiconductor memory chip 15 can be exposed. The plurality of semiconductor memory chips 15 is stacked in such a way that the side on which the electrode pads of each of the semiconductor memory chips 15 are arranged is opposite to the organic board 11. The exposed electrode pads are electrically connected (wire-bonded) to connection pads of the organic board 11 by the metal wire 27 such as an Au wire.

The controller chip 16 is mounted on the top face 11b of the organic board 11. The controller chip 16 selects the semiconductor memory chip 15 to/from which data is written/read from the plurality of semiconductor memory chips 15. The controller chip 16 controls semiconductor memory chip 15 to send a writing command to write data to the selected semiconductor memory chip 15 or a reading command to read data stored in the selected semiconductor memory chip 15. The controller chip 16 has electrode pads formed on the top face thereof. A plurality of electrode pads of the controller chip 16 is arranged on the periphery of the controller chip 16. The number of electrode pads (nearly equal to number of the metal wire electrically connected to the controller chip 16) held by the controller chip 16 is larger than that of electrode pads held by the semiconductor memory chip 15. The pitch of electrode pads held by the controller chip 16 is about 30 to 100 μm, which is narrower than the pitch of connection pads electrically connected to the controller chip 16 among the plurality of connection pads of the organic board 11. Electrode pads of the controller chip 16 and connection pads of the organic board 11 are wire-bonded by the metal wire 28.

The electronic components 17 are mounted on the top face 11b of the organic board 11. The electronic components 17 are, for example, chip capacitors, resistors, or inductors. With the electronic components 17 being arranged on the organic board 11, the electronic components 17 are electrically connected to the semiconductor memory chip 15 or the controller chip 16 via the internal wiring of the organic board without being connected by a metal wire. As a result, the parasitic capacitance and parasitic resistance of the semiconductor storage device 10 can be reduced.

The resin mold portion 18 is formed by sealing the top face 11b of the organic board 11 and both surfaces of the lead frames 13 with a sealing resin material. By sealing only the top face 11b of the organic board 11 with a resin material, the external connection terminals 19 are exposed to the outside. The resin mold portion 18 forms an outer shell of the semiconductor storage device 10. The resin mold portion 18 is formed with a height that completely covers the semiconductor memory chip 15 and the controller chip 16. The resin mold portion 18 is formed by covering the organic board 11 on which mounting components such as the semiconductor memory chip 15 are mounted and the lead frame 13 with a metal mold and infusing a softened resin material into the mold.

Next, the manufacturing process of the semiconductor storage device 10 will be described. FIG. 7 is a flow chart illustrating the manufacturing process of the semiconductor storage device 10. FIGS. 8A to 13 are diagrams illustrating the manufacturing process of the semiconductor storage device 10.

First, the organic board 11 is formed as an individual piece into a plane shape substantially identical to the area S (step S1). The organic board 11 is formed as an individual piece by a common process using a dicing blade (not illustrated) and thus, a detailed description thereof is omitted. Next, an adhesive 30 is applied to the board bonding portion 22 of the lead frame 13 (step S2, see also FIG. 8A). As the adhesive 30, for example, a thermosetting or photo-setting die attach film (adhesive film) or a liquid material having a common polyimide resin, epoxy resin, and acryl resin as main components is used. If the memory chip mounting portions 21 is directly bonded to the organic board 11, the adhesive 30 may be applied to a portion of the memory chip mounting portions 21 that comes into contact with the organic board 11 (see also FIG. 8B).

Figure 9:
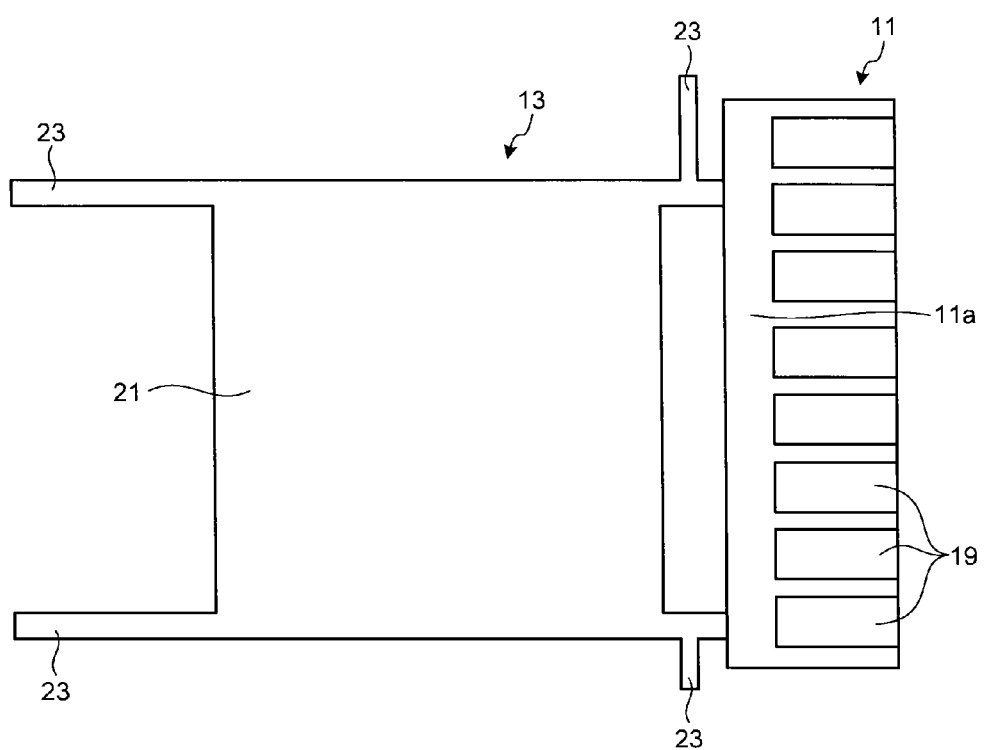
FIG. 9 is a diagram illustrating the manufacturing process of the semiconductor storage device.
Figure 10:
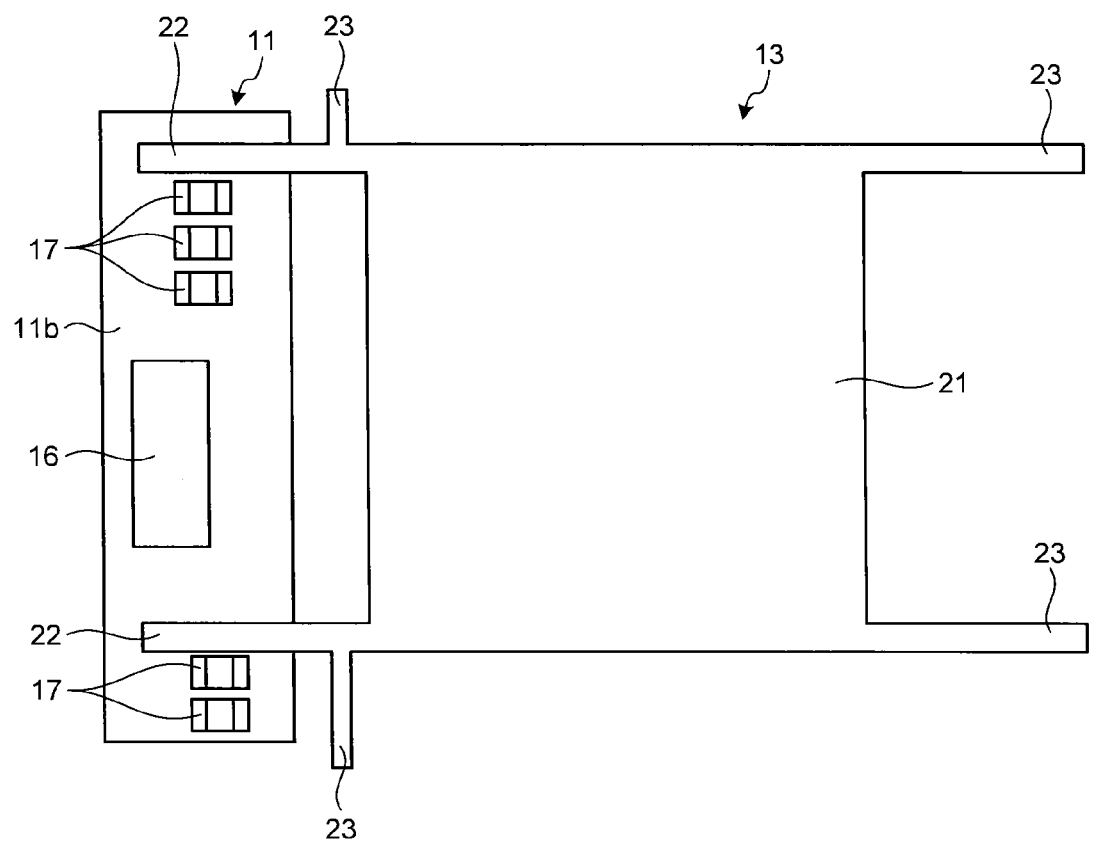
FIG. 10 is a diagram illustrating the manufacturing process of the semiconductor storage device.
Figure 11:
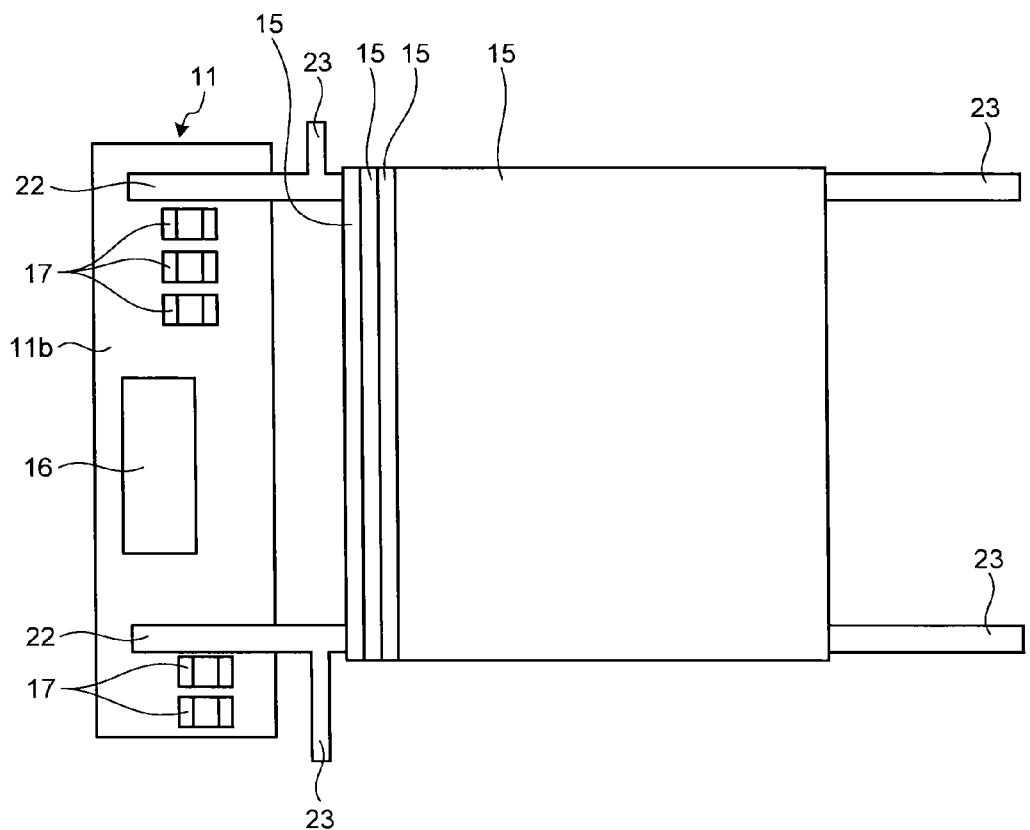
FIG. 11 is a diagram illustrating the manufacturing process of the semiconductor storage device.

The top face 11b of the organic board 11 is bonded to the board bonding portion 22 to which the adhesive 30 has been applied (step S3, see also FIG. 9). The controller chip 16 and the electronic components 17 are mounted on the top face 11b of the organic board 11 (step S4, see also FIG. 10). The semiconductor memory chip 15 is bonded to the memory chip mounting portions 21 via the adhesive material 25 and further thereon, the semiconductor memory chip 15 is bonded to stack the semiconductor memory chips 15 (step S5, see also FIG. 11).

Figure 12:
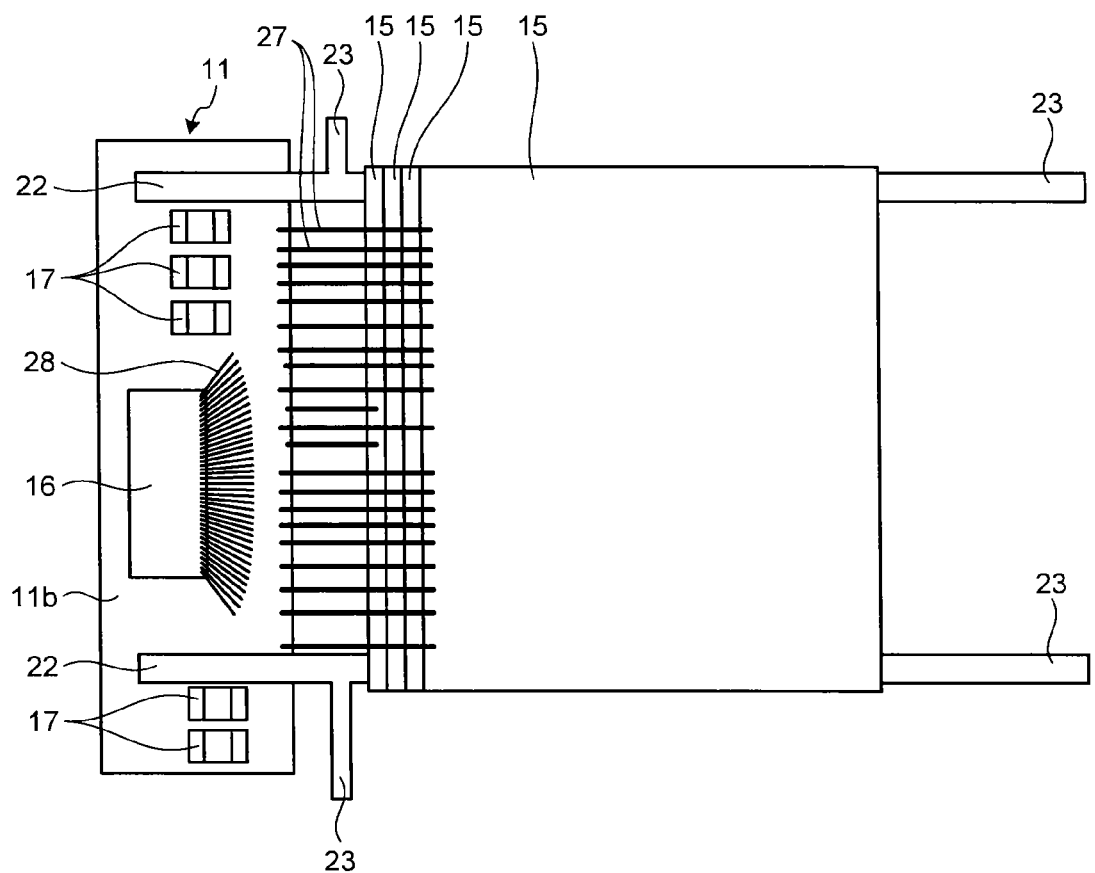
FIG. 12 is a diagram illustrating the manufacturing process of the semiconductor storage device.
Figure 13:
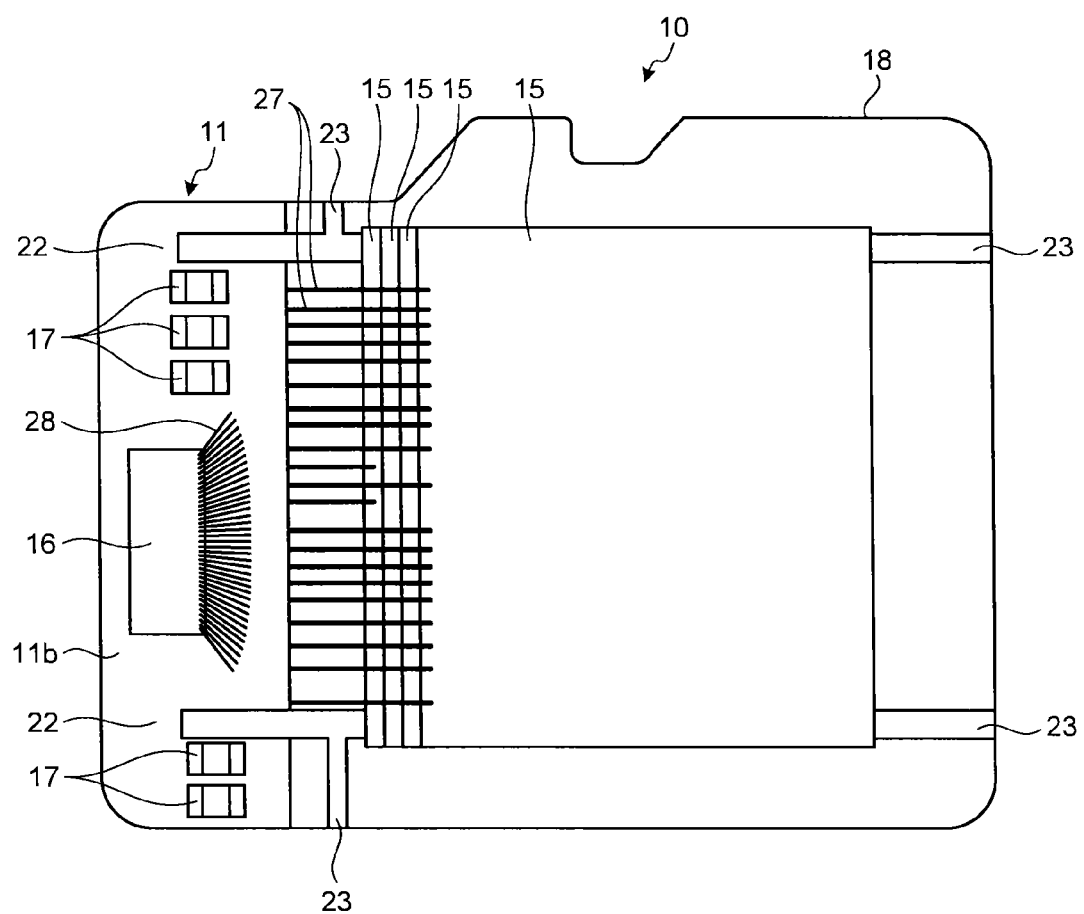
FIG. 13 is a diagram illustrating the manufacturing process of the semiconductor storage device.

Electrode pads of the semiconductor memory chip 15 and connection pads of the organic board 11 and electrode pads of the controller chip 16 and connection pads of the organic board 11 are wire-bonded by the metal wire 27 and the metal wire 28 respectively (step S6, see also FIG. 12). The top face 11b of the organic board 11 and both surfaces of the lead frames 13 are sealed with a resin material to form the resin mold portion 18 and the redundant portion 13a is cut off (step S7, see also FIG. 13). In FIG. 13, the internal configuration (such as the semiconductor memory chips 15) that is covered with the resin mold portion 18 and actually not recognizable by visual inspection is also illustrated for convenience of description. With a series of the above processes, the semiconductor storage devices 10 are manufactured.

Figure 14:
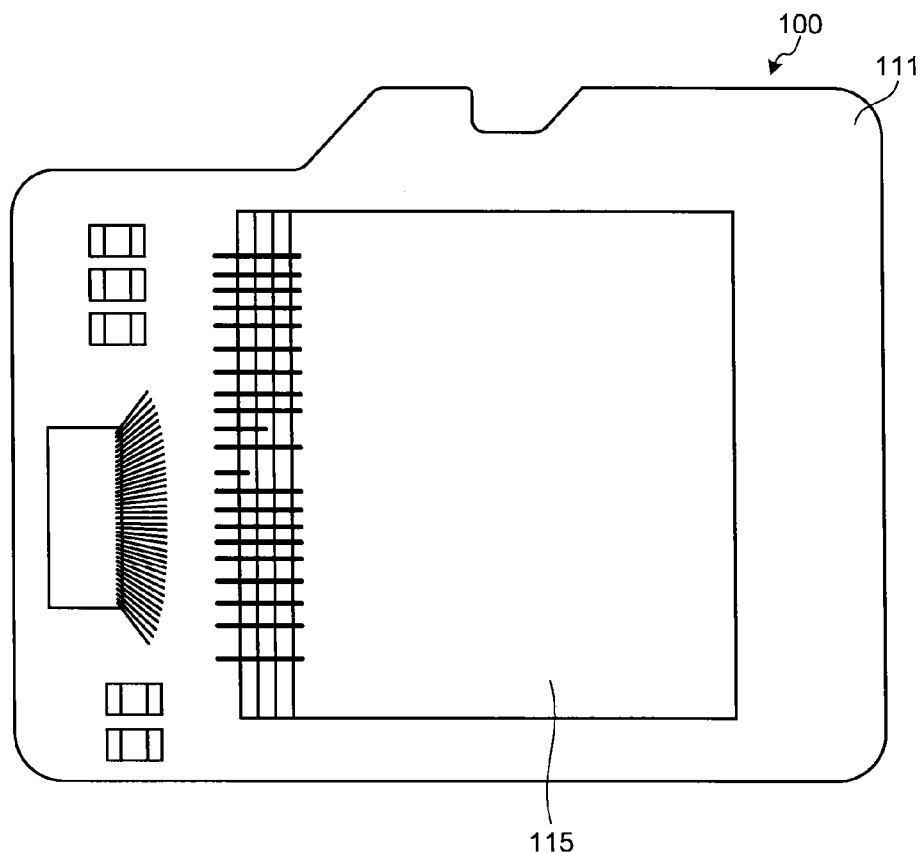
FIG. 14 is a diagram schematically illustrating the internal configuration of a semiconductor storage device as a conventional example.
Figure 15:
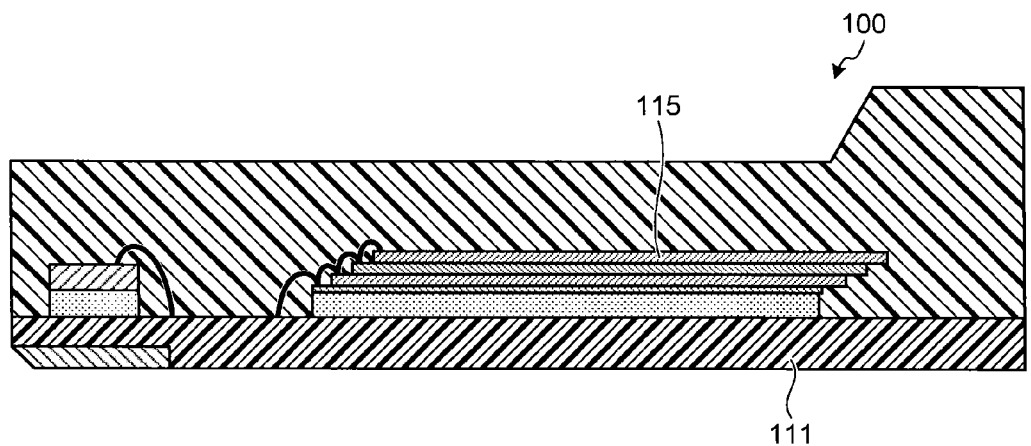
FIG. 15 is a cross sectional view illustrating the sectional structure of the semiconductor storage device illustrated in FIG. 14.

FIG. 14 is a diagram schematically illustrating the internal configuration of a semiconductor storage device 100 as a conventional example. FIG. 15 is a cross sectional view illustrating the sectional structure of the semiconductor storage device 100 illustrated in FIG. 14. As illustrated in FIGS. 14 and 15, semiconductor memory chips 115 are stacked on an organic board 111 in the conventional semiconductor storage device 100. Thus, the organic board 111 has a size of include an area to mount the semiconductor memory chips 115. In the semiconductor storage device 10 according to the first embodiment, on the other hand, the organic board 11 is formed as an individual piece into a plane shape substantially the same as that of the area S where the external connection terminals 19 are provided in the plane view and the semiconductor memory chip 15 is arranged on the lead frame 13. Therefore, compared with the conventional example, the usage of the organic board can significantly be reduced so that manufacturing costs of the semiconductor storage devices 10 can be held down.

The lead frame 13 is bonded to the organic board 11, thereby deciding a relative spatial relationship between the organic board 11 and the memory chip mounting portions 21. Accordingly, a position shift between the semiconductor memory chip 15 and the organic board 11 in the wire-bonding process is prevented. As a result, the reduction in yield can be held down. Moreover, the organic board 11 and the lead frame 13 are sealed by the resin mold portion 18 in the end and thus, high reliability of bonding between the organic board 11 and the lead frame 13 is not demanded. Then maintenance of bonding of both until the formation process of the resin mold portion 18 is enough.

When compared with the semiconductor memory chip 15, the controller chip 16 tends to have more electrode pads formed thereof. Also when compared with the semiconductor memory chip 15, the controller chip 16 tends to be formed in a smaller plane shape when viewed from the top face. Therefore, electrode pads and connection pads to wire-bond the controller chip 16 are formed more densely than those to wire-bond the semiconductor memory chip 15. In the first embodiment, the controller chip 16 is mounted on the organic board 11, instead of the lead frame 13, and thus, wire-bonding can be carried out reliably even under the conditions of densely formed electrode pads and connection pads. On the other hand, electrode pads and connection pads for wire-bonding of the semiconductor memory chip 15 have relatively wider interval thereof. Thus, wire-bonding of the semiconductor memory chip 15 is relatively easy and wire-bonding can be carried out even if the semiconductor memory chip 15 is mounted on the lead frame 13.

The controller chip 16 and the electronic components 17 are mounted on the top face 11b of the organic board 11 and thus, the side of the bottom face 11a of the organic board 11, that is, the side on which the external connection terminals 19 are formed can be made substantially flat. This can contribute to the reduction in size of the semiconductor storage devices 10. Moreover, by reducing unevenness on the outer circumferential surface of the semiconductor storage devices 10, a contribution can be made to realization of smooth insertion/removal into/from an electronic device of the semiconductor storage devices 10.

The external connection terminals 19, the semiconductor memory chip 15, the controller chip 16, and the electronic components 17 are connected via the internal wiring of the organic board 11. That is, while the semiconductor memory chip 15, the controller chip 16, and the electronic components 17 are electrically connected without going through a lead component. Accordingly, a cut portion of the redundant portion 13a is exposed to the outer side surface of the resin mold portion 18 and insulation processing for the portion can be saved, further holding down manufacturing costs of the semiconductor storage devices 10.

By reducing the size of the plane shape of the organic board 11, deformation of the organic board 11 due to heat applied to the organic board 11 in a mounting process or the like of the electronic components 17 can be suppressed. The organic board 11 has, as described above, a multi-layer structure and materials used for each layer may be different. If materials used for each layer are different, the coefficient of linear expansion is different from layer to layer, making deformation due to a heat history more likely. With a reduced size of the plane shape of the organic board 11, the ratio of the organic board 11 to the whole semiconductor storage device 10 decreases, making deformation in the whole semiconductor storage device 10 less likely.

The decision of the relative spatial relationship between the memory chip mounting portion 21 and the organic board 11 is not limited to the case of being made by bonding of the lead frame 13. For example, the organic board 11 and the lead frame 13 may be separately fixed by a mold to form the resin mold portion 18. With the organic board 11 and the lead frame 13 being fixed to a mold, the spatial relationship relative to each other is decided.

The first embodiment is described by taking an example in which the plurality of semiconductor memory chips 15 is stacked on the memory chip mounting portion 21, but the semiconductor storage device 10 may be configured by bonding only one semiconductor memory chip 15 onto the memory chip mounting portion 21.

Further, the first embodiment is described by taking an example in which the connection portion 23 of the lead frame 13 protrudes to the outer side from the resin mold portion 18, but the present embodiment is not limited to this and the board bonding portion 22 may protrude to the outer side from the resin mold portion 18. Or, for example, the board bonding portion 22 may be configured to be connected to the adjacent memory chip mounting portion by protruding to the opposite side of the memory chip mounting portion 21 sandwiching the organic board 11 therebetween.

If the lead frame 13 using a non-conductive material (for example, polyethylene naphthalate and polyethylene terephthalate) is used, a short-circuit to the semiconductor memory chip 15 can reliably be prevented even if a portion of the lead frame 13 protruding to the outer side of the resin mold portion 18 and a socket through which the semiconductor storage device 10 is inserted come into contact erroneously. This is because the lead frame 13 is non-conductive and thus, the semiconductor memory chip 15 arranged on the board bonding portion 22 and the socket can electrically be separated.

The manufacturing process of the semiconductor storage device 10 is not limited to the flow chart in FIG. 7. For example, before the organic board 11 is bonded to the lead frame 13, the controller chip 16 and electronic devices may be mounted on the organic board 11. Alternatively, before the organic board 11 being formed as an individual piece, the controller chip 16 and electronic devices may be mounted on the organic board 11.

The first embodiment is described by taking an example in which the micro SD card is used as the semiconductor storage device 10, but the present invention is not limited to this and can be applied to various storage devices configured by including a semiconductor memory chip.

Figure 16:
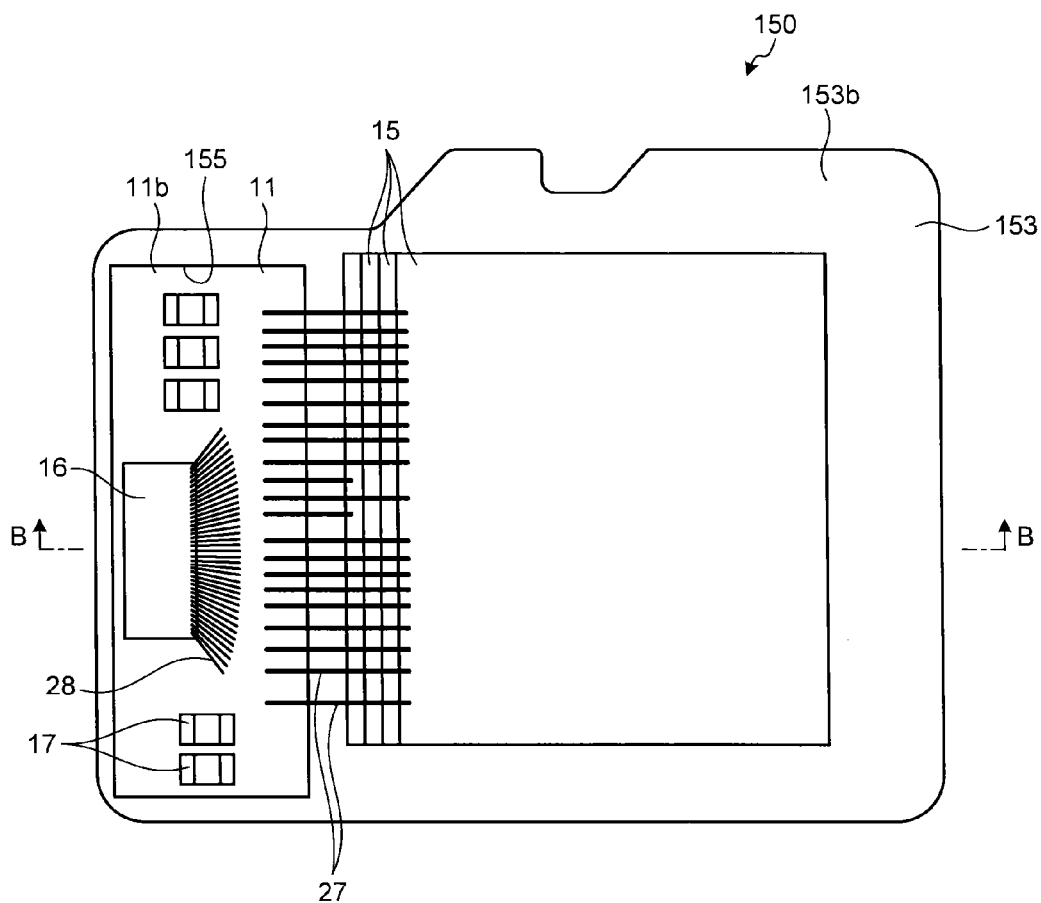
FIG. 16 is a plan view schematically illustrating the internal configuration of the semiconductor storage device according to a second embodiment.
Figure 17:
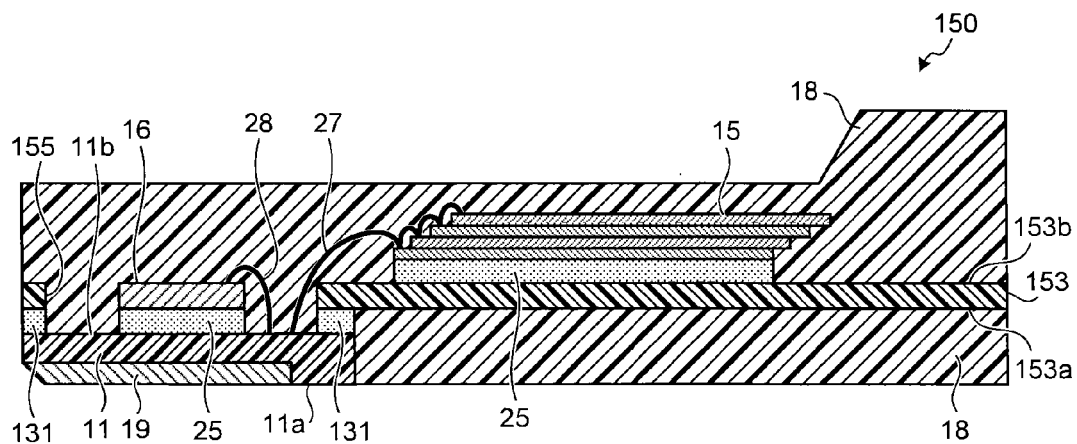
FIG. 17 is a cross sectional view illustrating the sectional structure along a B-B line of the semiconductor storage device illustrated in FIG. 16.

FIG. 16 is a plan view schematically illustrating the internal configuration of the semiconductor storage device according to a second embodiment. FIG. 17 is a cross sectional view illustrating the sectional structure along the B-B line of the semiconductor storage device illustrated in FIG. 16. The same reference numerals are attached to components similar to those in the above embodiment and a detail description thereof is omitted. The appearance of a semiconductor storage device 150 according to the second embodiment is substantially the same as that in the first embodiment and thus, an outside view thereof is also omitted. That is, in FIG. 16, like in FIG. 3A, the resin mold portion 18 is omitted.

The semiconductor storage device 150 includes the organic board 11, a non-conductive supporting board 153, the semiconductor memory chips 15, the controller chip 16, the electronic components 17, and the resin mold portion 18.

The non-conductive supporting board 153 has substantially the same external shape as that of the semiconductor storage device 10 in the first embodiment, but has an opening 155 in a portion where the organic board 11 is arranged. The organic board 11 is connected to the non-conductive supporting board 153 on at least one side of the opening 155 via an adhesive 131. On a second surface 153b, the controller chip 16 and the electronic components 17 are exposed through the opening 155 on the top face 11b of the organic board 11 and electrode pads of the semiconductor memory chip 15 and connection pads of the organic board 11 and electrode pads of the controller chip 16 and connection pads of the organic board 11 are connected by the metal wire 27 and the metal wire 28 respectively. On a first surface 153a, the external connection terminals 19 of the organic board 11 are exposed from the resin mold portion 18.

Figure 18:
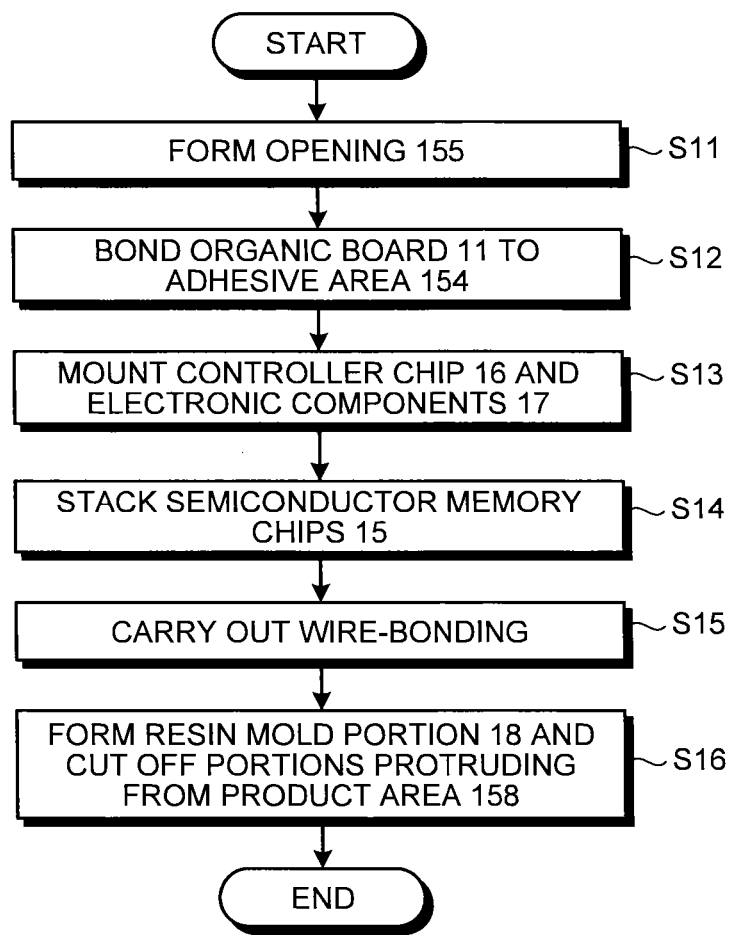
FIG. 18 is a flow chart illustrating the manufacturing process of the semiconductor storage device.
Figure 19:
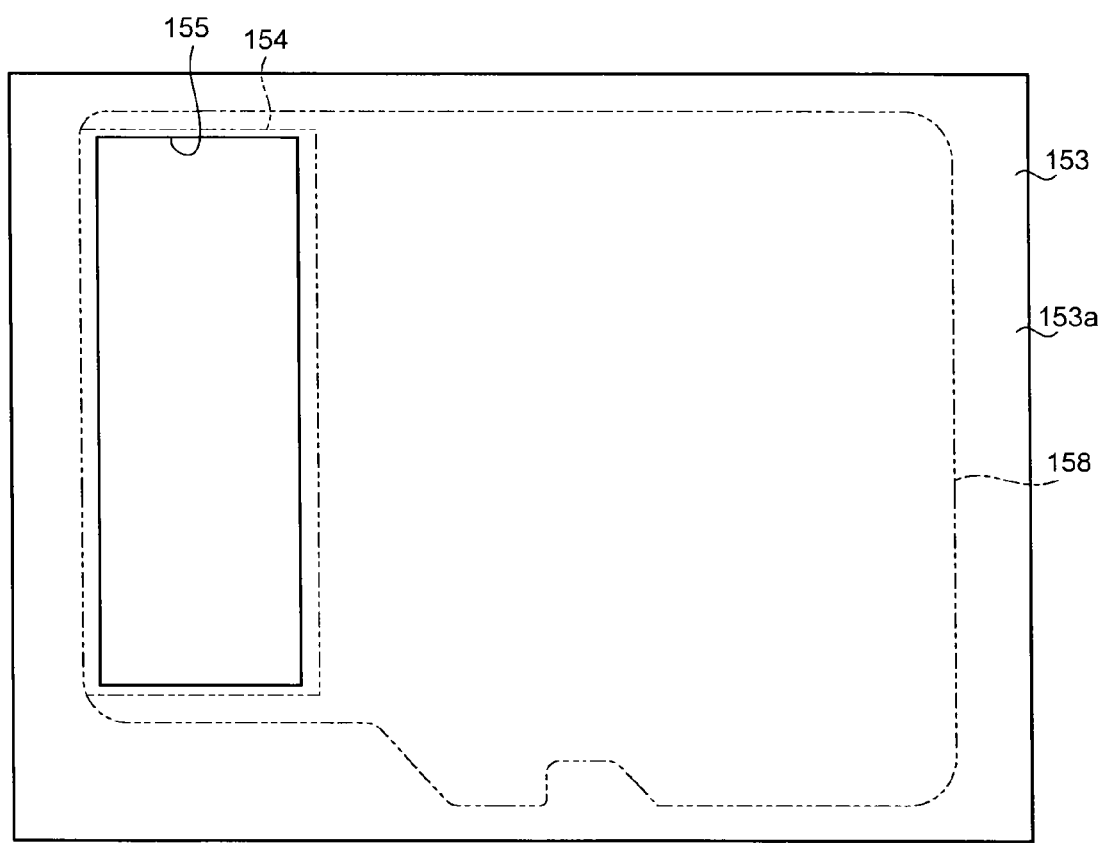
FIG. 19 is a diagram of a non-conductive supporting board when viewed from a first surface side.

The above difference will be described below while describing the manufacturing process of the semiconductor storage devices 150. FIG. 18 is a flow chart illustrating the manufacturing process of the semiconductor storage device 150. FIG. 19 is a diagram of the non-conductive supporting board 153 when viewed from the first surface 153a side. FIGS. 20 to 24 are diagrams illustrating the manufacturing process of the semiconductor storage device 150.

The non-conductive supporting board 153 is a plate member using a resin material such as a non-conductive material, for example, polyethylene naphthalate and polyethylene terephthalate. While FIG. 19 illustrates the non-conductive supporting board 153 in a state in which only one product area 158 to be the final product shape of the semiconductor storage devices 150 is formed, one large non-conductive supporting board 153 in which the plurality of product areas 158 is formed may also be used.

An adhesive area 154 where the organic board 11 is bonded is provided on the side of the first surface 153a of the non-conductive supporting board 153. First, the opening 155 is formed in a portion of the adhesive area 154 (step S11).

Figure 20:
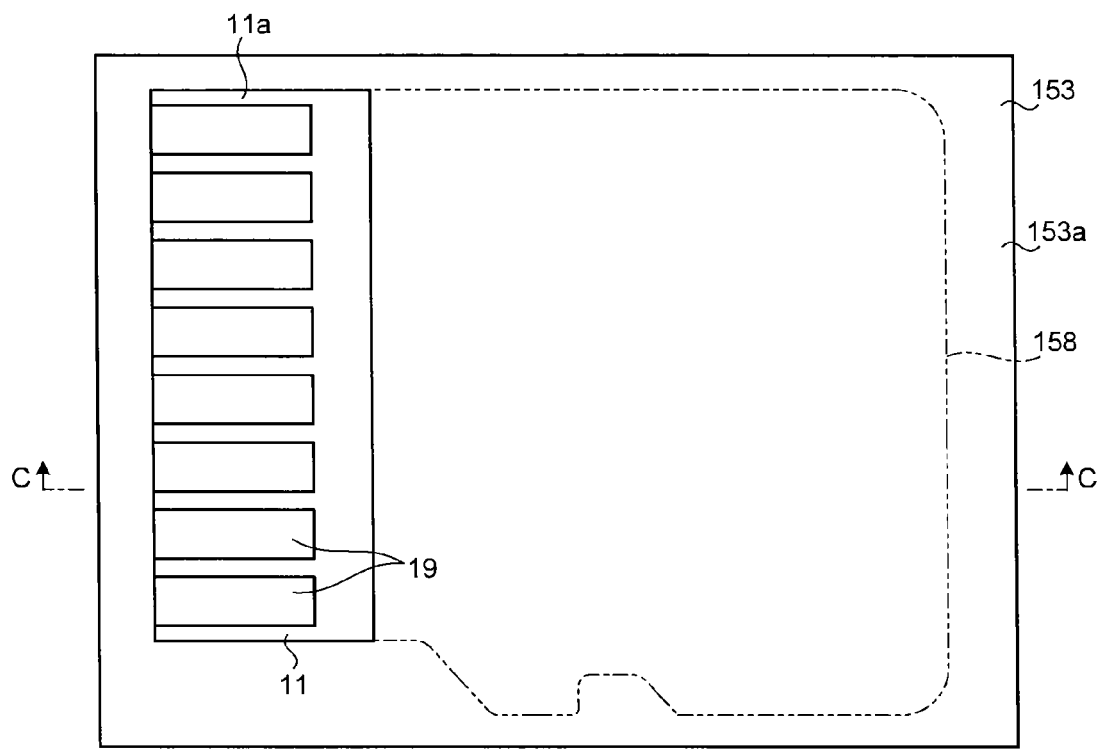
FIG. 20 is a diagram illustrating the manufacturing process of the semiconductor storage device.
Figure 21:
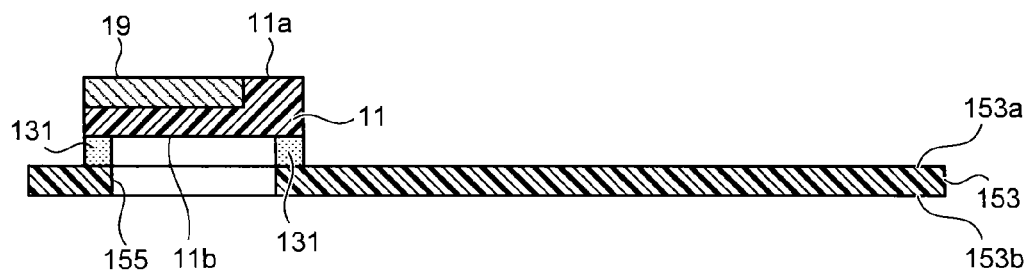
FIG. 21 is a diagram illustrating the manufacturing process of the semiconductor storage device and an arrowed sectional view along a C-C line illustrated in FIG. 20.

The organic board 11 is bonded to the adhesive area 154 in which the opening 155 is formed (step S12). FIG. 20 illustrates a state in which the non-conductive supporting board 153 is viewed from the second surface 153b. As illustrated in FIGS. 20 and 21, because the opening 155 is formed in the adhesive area 154, a portion of the top face 11b of the organic board 11 is exposed through the opening 155 also after the top face 11b of the organic board 11 being bonded to the adhesive area 154.

Figure 22:
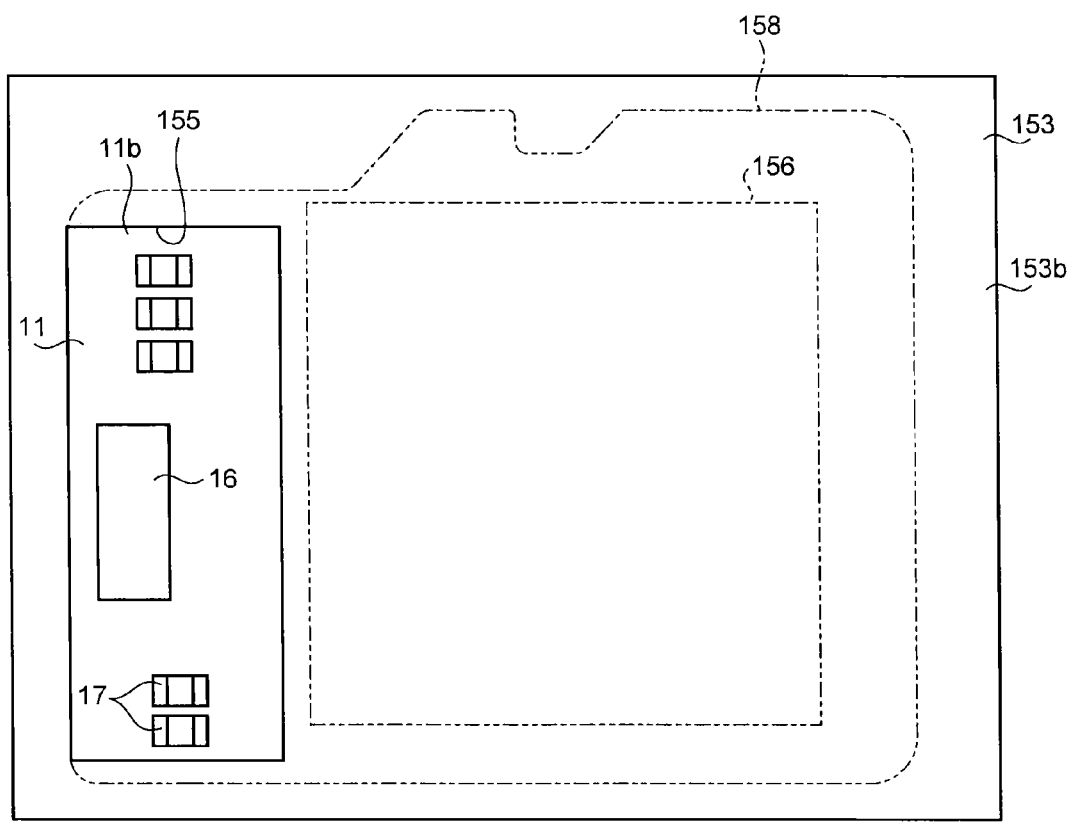
FIG. 22 is a diagram illustrating the manufacturing process of the semiconductor storage device.
Figure 23:
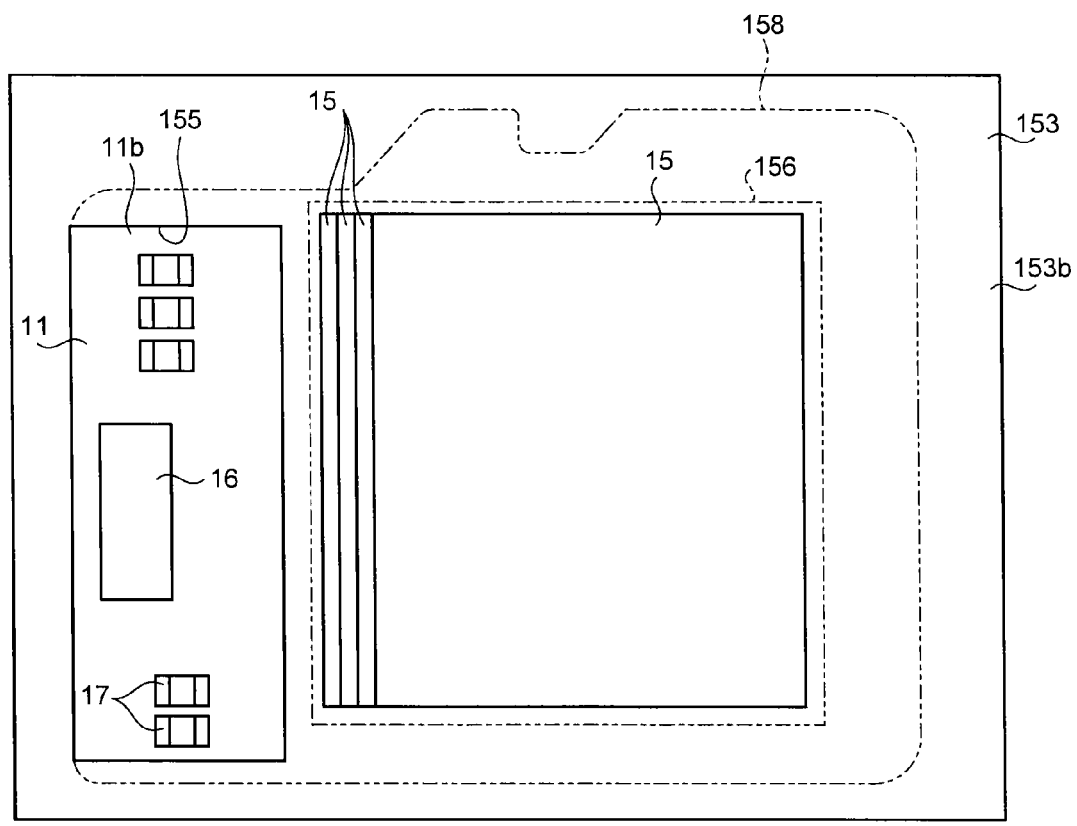
FIG. 23 is a diagram illustrating the manufacturing process of the semiconductor storage device.

The controller chip 16 and the electronic components 17 are mounted on the top face 11b of the organic board 11 exposed through the opening 155 (step S13, see also FIG. 22).

A memory chip mounting portion 156 to stack the semiconductor memory chip 15 is provided in a position that does not overlap with the opening 155 on the side of the second surface 153b of the non-conductive supporting board 153. The semiconductor memory chip 15 is stacked in the memory chip mounting portion 156 (step S14, see also FIG. 23).

Figure 24:
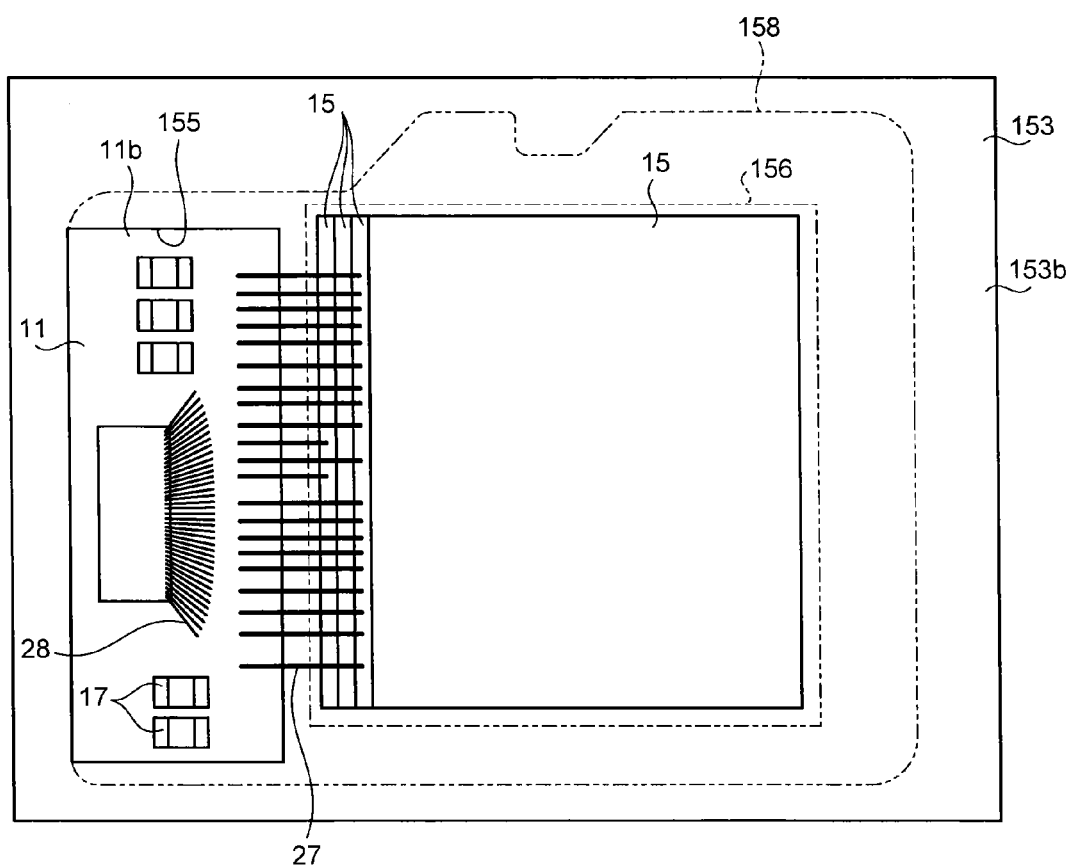
FIG. 24 is a diagram illustrating the manufacturing process of the semiconductor storage device.

Electrode pads of the semiconductor memory chip 15 and connection pads of the organic board 11 and electrode pads of the controller chip 16 and connection pads of the organic board 11 are wire-bonded by the metal wire 27 and the metal wire 28 respectively (step S15, see also FIG. 24). Accordingly, the wiring layer of the organic board 11 and the semiconductor memory chip 15 are electrically connected.

Both surfaces of the non-conductive supporting board 153 are sealed with a resin material to form the resin mold portion 18 and a protruding portion from the product area 158 is cut off (step S16). The semiconductor storage devices 150 illustrated in FIGS. 16 and 17 are thereby manufactured. Processes such as forming the organic board 11 as an individual piece into substantially the same shape as that of the area S (see also FIG. 5) are performed like in the first embodiment.

According to the second embodiment, as described above, the organic board 11 as an individual piece is formed into substantially the same shape as that of the area S and thus, the usage of the organic board can significantly be reduced so that manufacturing costs of the semiconductor storage devices 150 can be held down.

Moreover, the organic board 11 and the non-conductive supporting board 153 are bonded by the adhesive 131, thereby deciding a relative spatial relationship between the organic board 11 and the memory chip mounting portion 156. Accordingly, a position shift between the semiconductor memory chip 15 and the organic board 11 in the wire-bonding process is prevented. As a result, the reduction in yield can be held down. The organic board 11 is bonded to the non-conductive supporting board 153 via the adhesive 131 all there around and therefore, a position shift between the semiconductor memory chip 15 and the organic board 11 can effectively be prevented. Moreover, the organic board 11 and the non-conductive supporting board 153 are sealed by the resin mold portion 18 in the end and thus, high reliability of bonding between the organic board 11 and the non-conductive supporting board 153 is not demanded. Maintenance of bonding between the organic board 11 and the non-conductive supporting board 153 until the formation process of the resin mold portion 18 is enough.

The controller chip 16 and the electronic components 17 are mounted on the top face 11b of the organic board 11 and thus, the side of the bottom face 11a of the organic board 11, that is, the side on which the external connection terminals 19 are formed can be made substantially flat. This can contribute to the reduction in size of the semiconductor storage devices 150. Moreover, by reducing unevenness on the outer circumferential surface of the semiconductor storage device 150, a contribution can be made to realization of smooth insertion/removal into/from an electronic device of the semiconductor storage devices 150. The top face 11b is positioned closer to the side of the first surface 153a than the second surface 153b. Thus, the bottom of the controller chip 16 and the electronic components 17 are considered to be positioned lower (on the side of the first surface 153a) than the bottom of the semiconductor memory chip 15. As a result, the controller chip 16 and the electronic components 17 whose height is relatively high can be used.

By reducing the size of the plane shape of the organic board 11, deformation of the organic board 11 due to heat applied to the organic board 11 in a mounting process or the like of the electronic components 17 can be suppressed. The organic board 11 has, as described above, a multi-layer structure and materials used for each layer may be different. If materials used for each layer are different, the coefficient of linear expansion is different from layer to layer, making deformation due to a heat history more likely. With a reduced size of the plane shape of the organic board 11, the ratio of the organic board 11 to the whole semiconductor storage device 150 decreases, making deformation in the whole semiconductor storage device 150 less likely.

The non-conductive supporting board 153 is formed of a non-conductive material. Thus, a short-circuit to the semiconductor memory chip 15 can reliably be prevented even if the non-conductive supporting board 153 exposed to the outer circumferential surface of the semiconductor storage device 150 and a socket through which the semiconductor storage device 150 is inserted come into contact erroneously. This is because the non-conductive supporting board 153 is non-conductive and thus, the semiconductor memory chip 15 arranged on the memory chip mounting portion 156 and the socket can electrically be separated.

The second embodiment is described by taking an example in which the plurality of semiconductor memory chips 15 is stacked on the memory chip mounting portion 156, but the present embodiment is not limited to this and the semiconductor storage device 150 may be configured by bonding only one semiconductor memory chip 15 onto the memory chip mounting portion 156.

The manufacturing process of the semiconductor storage device 150 is not limited to the flow chart in FIG. 18. For example, before the organic board 11 is bonded to the non-conductive supporting board 153, the controller chip 16 and the electronic components 17 may be mounted on the organic board 11. Alternatively, before the organic board 11 being formed as an individual piece, the controller chip 16 and the electronic components 17 may be mounted on the organic board 11.

Figure 25:
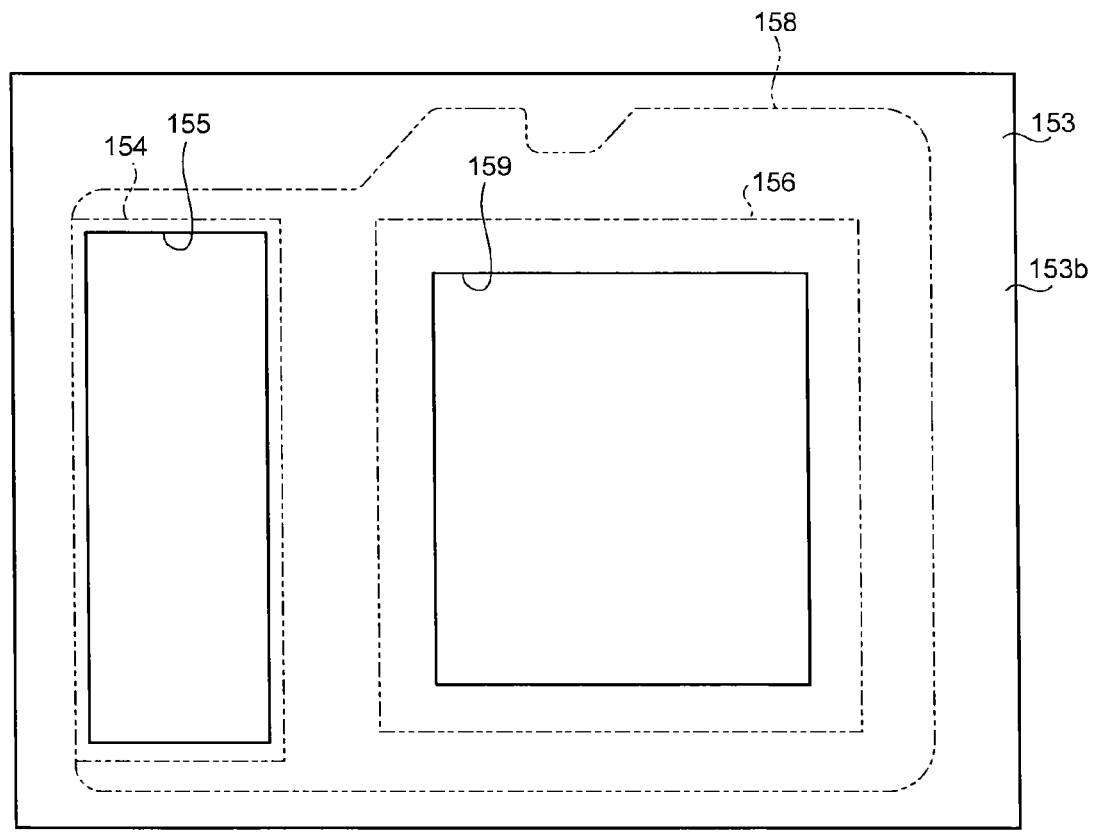
FIG. 25 is a plan view illustrating the non-conductive supporting board included in the semiconductor storage device according to a first modification of the second embodiment.

FIG. 25 is a plan view illustrating the non-conductive supporting board 153 included in the semiconductor storage device 150 according to the first modification of the second embodiment. In a first modification, an opening 159 is formed in the memory chip mounting portion 156, as well as in the adhesive area 154.

Figure 26:
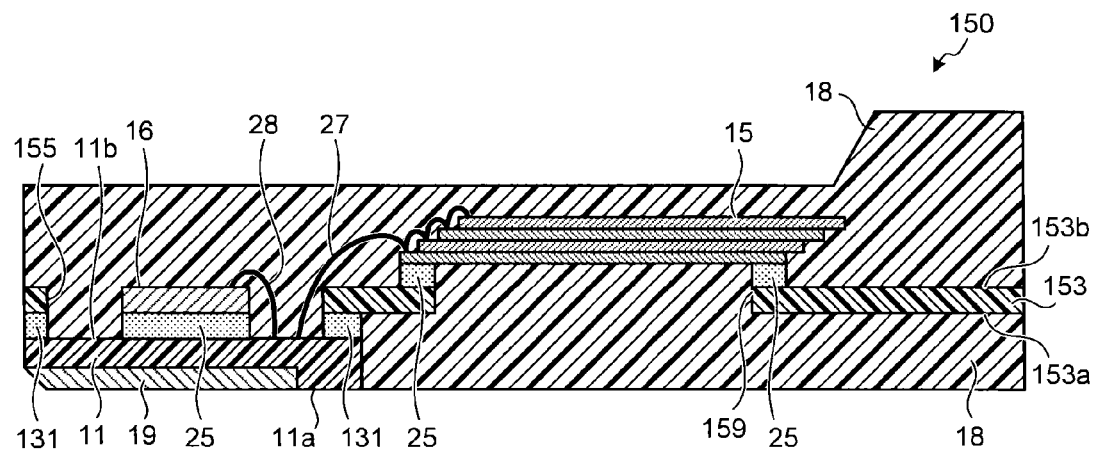
FIG. 26 is a sectional view of the semiconductor storage device including the non-conductive supporting board illustrated in FIG. 25.

FIG. 26 is a sectional view of the semiconductor storage device 150 including the non-conductive supporting board 153 illustrated in FIG. 25 and corresponds to the cross sectional view illustrating the sectional structure along the B-B line in FIG. 16. As shown in FIG. 26, the opening 159 is smaller than the semiconductor memory chip 15 and the periphery of the semiconductor memory chip 15 is connected to the non-conductive supporting board 153 via the adhesive material 25. As a result, a portion of the rear face (the surface opposite to the non-conductive supporting board 153) of the semiconductor memory chip 15 is exposed through the opening 159. By forming the opening 159 in the memory chip mounting portion 156, the resin mold portion 18 covering the first surface 153a of the non-conductive supporting board 153 comes into contact with not only the non-conductive supporting board 153, but also the rear face of the semiconductor memory chip 15.

If, for example, the adhesion between a resin material forming the resin mold portion 18 and the semiconductor memory chip 15 is stronger than that between the resin material forming the resin mold portion 18 and the non-conductive supporting board 153, the adhesion of the resin mold portion 18 can be increased by bringing the resin mold portion 18 and the semiconductor memory chip 15 into contact as the configuration of the first modification. Accordingly, the resin mold portion 18 can be made less likely to rise from or peel off the non-conductive supporting board 15.

The opening 159 in the memory chip mounting portion 156 may be formed, for example, at the same time as the formation of the opening 155 shown in step S11. As a result, the process can be made simpler.

Figure 27:
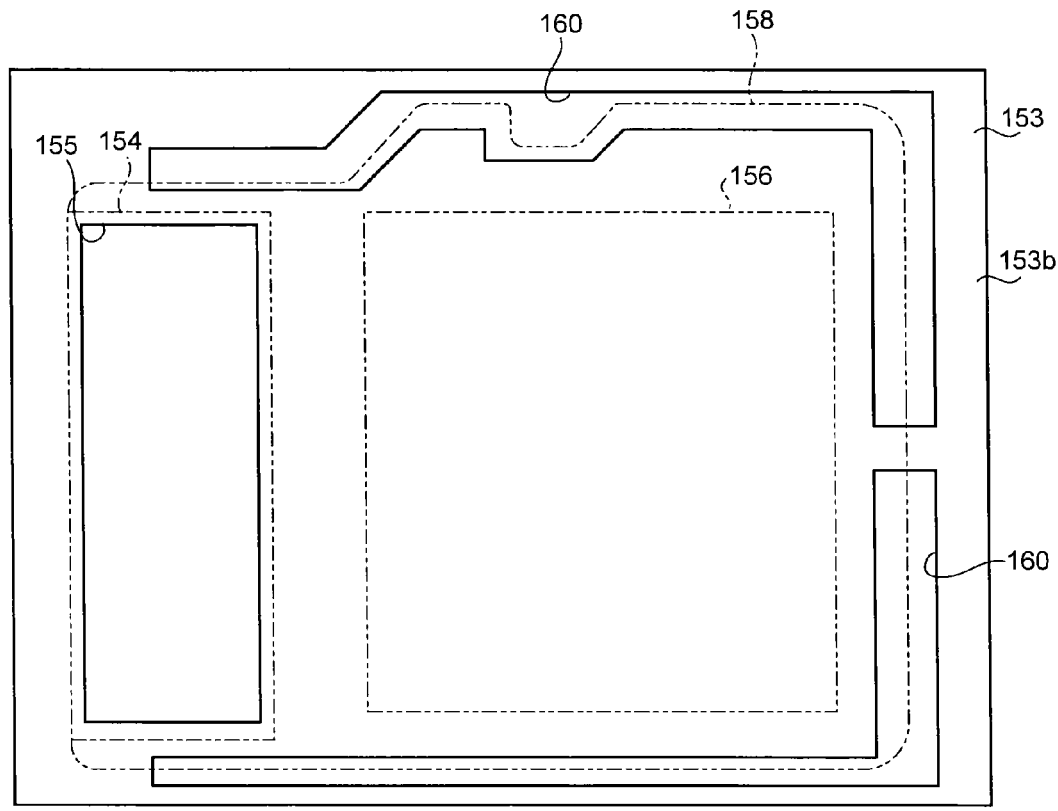
FIG. 27 is a plan view illustrating the non-conductive supporting board included in the semiconductor storage device according to a second modification of the second embodiment.

FIG. 27 is a plan view illustrating the non-conductive supporting board 153 included in the semiconductor storage device 150 according to a second modification of the second embodiment. In the second modification, an opening 160 is formed in areas excluding the adhesive area 154 and the memory chip mounting portion 156 as if to straddle an outer edge of the product area 158. The plurality of openings 160 is formed along the outer edge of the product area 158. Moreover, in the second modification, the product area 158 and a portion of other areas are partially connected.

Figure 28:
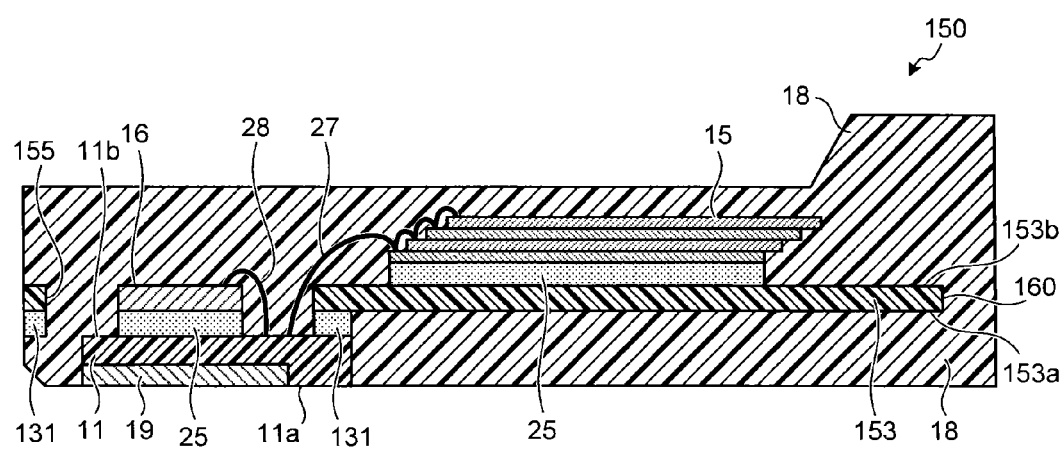
FIG. 28 is a sectional view of the semiconductor storage device including the non-conductive supporting board illustrated in FIG. 27.

FIG. 28 is a sectional view of the semiconductor storage device 150 including the non-conductive supporting board 153 illustrated in FIG. 27 and corresponds to the cross sectional view illustrating the sectional structure along the B-B line in FIG. 16. In the second modification, as shown in FIG. 28, the organic board 11 is bonded to the non-conductive supporting board 153 by the adhesive 131 in such a way that the organic board 11 does not overlap with a portion of the opening 155 (a portion of a boundary between the opening 155 and the non-conductive supporting board 153). More specifically, the organic board 11 is bonded to the non-conductive supporting board 153 in such a way that the organic board 11 does not overlap with a boundary between the opening 155 and the non-conductive supporting board 153 in an outer edge portion (the side on the opposite side of the memory chip mounting portion 156 of the organic board 11 in FIG. 27) of the product area 158.

With the configuration described above, the resin mold portions 18 covering the both surfaces 153a and 153b of the non-conductive supporting board 153 are integrated through the opening 155. Thus, the resin mold portion 18 becomes less likely to rise from or peel off the non-conductive supporting board 153.

Also, the resin mold portions 18 covering the both surfaces 153a and 153b are integrated through an opening 160 portion, making the resin mold portion 18 less likely to rise from or peel off the non-conductive supporting board 153. Incidentally, if one of the opening 155 and the opening 160 is formed, the resin mold portion 18 becomes less likely to rise from or peel off the non-conductive supporting board 153.

Figure 29:
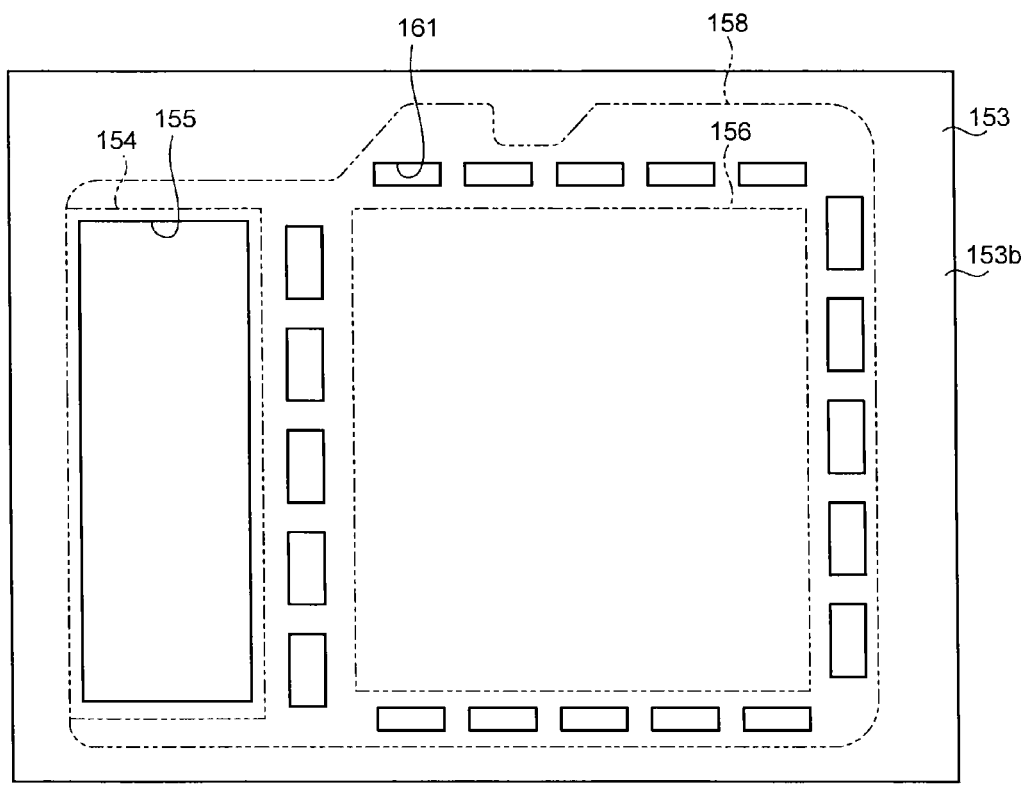
FIG. 29 is a plan view illustrating the non-conductive supporting board included in the semiconductor storage device according to a third modification of the second embodiment.

FIG. 29 is a plan view illustrating the non-conductive supporting board 153 included in the semiconductor storage device 150 according to a third modification of the second embodiment. In the third modification, an opening 161 is formed in areas excluding the adhesive area 154 and the memory chip mounting portion 156. More specifically, the plurality of openings 161 is formed to surround the memory chip mounting portion 156.

Figure 30:
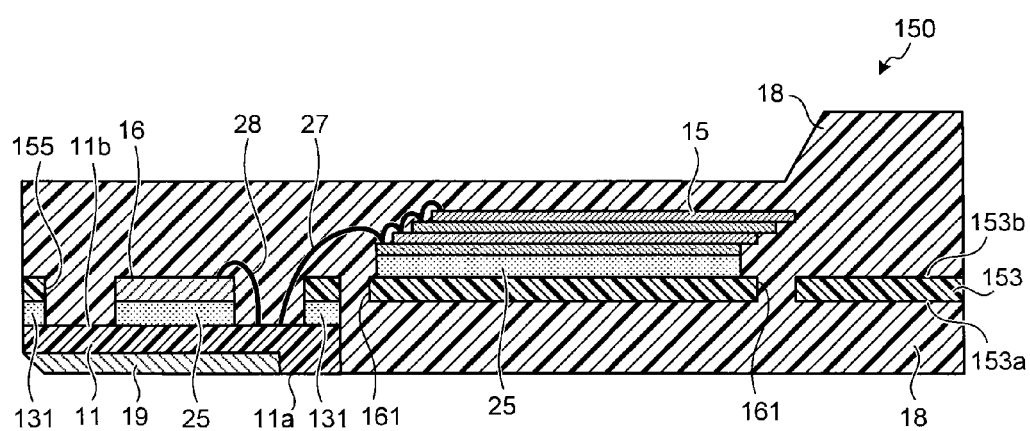
FIG. 30 is a sectional view of the semiconductor storage device including the non-conductive supporting board illustrated in FIG. 29.

FIG. 30 is a sectional view of the semiconductor storage device 150 including the non-conductive supporting board 153 illustrated in FIG. 29 and corresponds to the cross sectional view illustrating the sectional structure along the B-B line in FIG. 16. Like in the second modification, the resin mold portions 18 covering the both surfaces 153a and 153b are integrated through the openings 161 and thus, the resin mold portion 18 becomes less likely to rise from or peel off the non-conductive supporting board 153. Only if the openings 161 are formed on any one side of sides surrounding the memory chip mounting portion 156, the opening 161 has an effect of making the resin mold portion 18 less likely to rise from or peel off the non-conductive supporting board 153. By forming a plurality of relatively small openings 161, instead of forming one large opening 161, the strength of the non-conductive supporting board 153 can be increased so that poor connection of the metal wire 27 during wire-bonding can be reduced.

Figure 31:
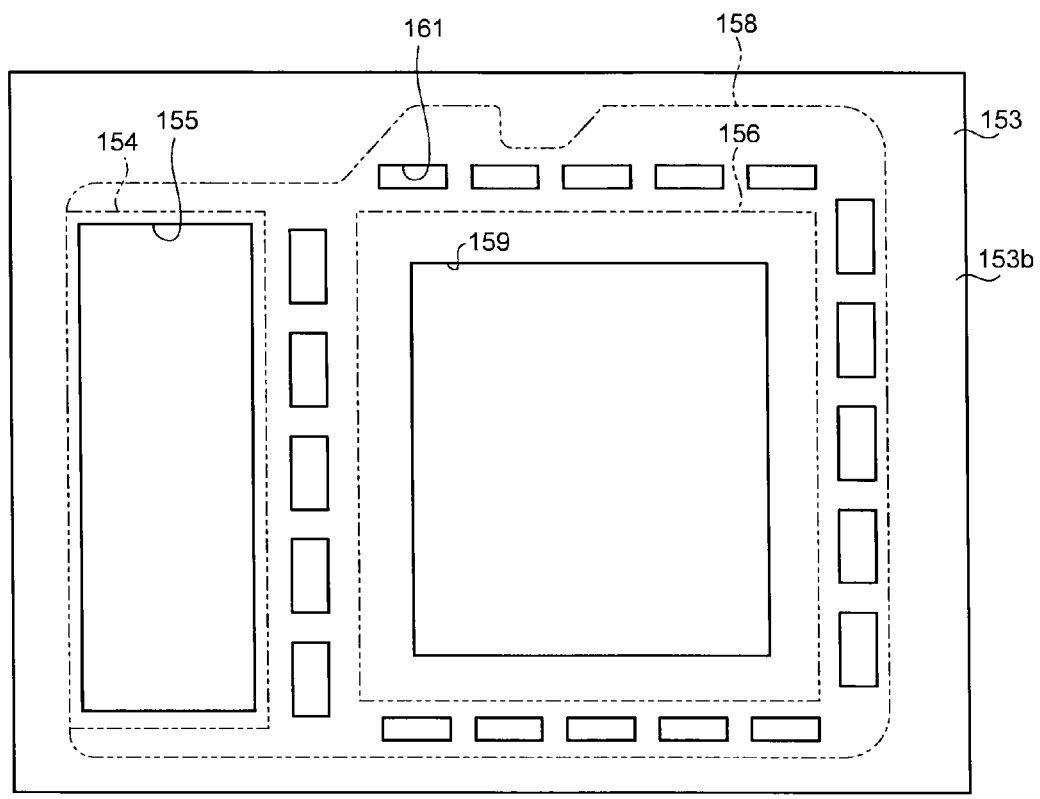
FIG. 31 is a plan view illustrating the non-conductive supporting board included in the semiconductor storage device according to a fourth modification of the second embodiment.

FIG. 31 is a plan view illustrating the non-conductive supporting board 153 included in the semiconductor storage device 150 according to a fourth modification of the second embodiment. In the fourth modification, the opening 159 is formed in the memory chip mounting portion 156 and the openings 161 are formed so as to surround the memory chip mounting portion 156.

Figure 32:
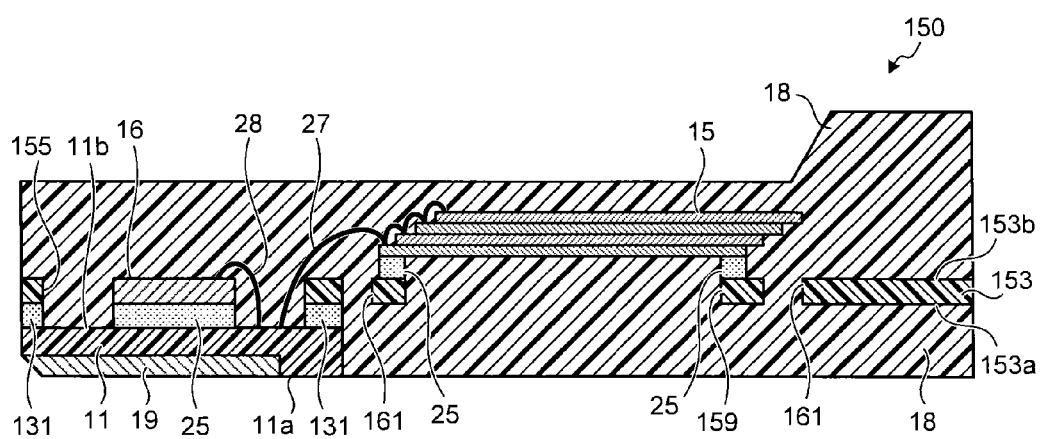
FIG. 32 is a sectional view of the semiconductor storage device including the non-conductive supporting board illustrated in FIG. 31.

FIG. 32 is a sectional view of the semiconductor storage device 150 including the non-conductive supporting board 153 illustrated in FIG. 31 and corresponds to the cross sectional view illustrating the sectional structure along the B-B line in FIG. 16. As illustrated in FIG. 32, the resin mold portion 18 comes into contact with the semiconductor memory chip 15 through the opening 159 and the resin mold portions 18 covering the both surfaces 153a and 153b of the non-conductive supporting board 153 are integrated through the openings 161 and thus, the resin mold portion 18 becomes less likely to rise from or peel off the non-conductive supporting board 153.

The fourth modification is a combination of the first modification and the third modification and has effects of the both modifications.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the sprit of the inventions. The accompanying claims and their equivalents are intended to cover such forms or modifications as would fall within the scope and spirit of the inventions.

What is claimed is:

1. A semiconductor storage device, comprising:
an organic board which is provided with external connection terminals on one surface side and in which internal wiring is formed;
a lead frame positioned relative to another surface side that is a surface side opposite to the one surface side of the organic board;
a semiconductor memory chip provided on a surface side, which is opposite to a surface positioned to the organic board, of the lead frame via an adhesive material;
a controller chip that is provided on the another surface side via an adhesive material and is configured to control the semiconductor memory chip;
a metal wire configured to electrically connect the semiconductor memory chip and the controller chip with the internal wiring without going through the lead frame; and
a resin mold portion covering the semiconductor memory chip, the controller chip, and the metal wire, wherein
the resin mold portion seals the another surface side with the one surface side being exposed, and
the lead frame is exposed from a side face different from a side on which the organic board is provided relative to the semiconductor memory chip, within side faces of the resin mold portion which are substantially perpendicular to the one surface side.

2. The semiconductor storage device according to claim 1, wherein the lead frame is bonded to the organic board by using photo-setting or thermosetting film adhesive to be positioned to the organic board.

3. The semiconductor storage device according to claim 1, wherein the lead frame includes a connection portion whose portion protruding from the side faces of the resin mold portion is cut off, and the portion cut off from the connection portion is exposed from the side faces of the resin mold portion.

4. The semiconductor storage device according to claim 1, wherein the organic board is formed as an individual piece into a plane shape substantially identical to an area where the external connection terminals are provided.

* * * * *